(12) United States Patent
Minev et al.

(10) Patent No.: US 12,093,782 B2
(45) Date of Patent: Sep. 17, 2024

(54) TRANSLATION OF A QUANTUM DESIGN ACROSS MULTIPLE APPLICATIONS

(71) Applicant: International Business Machines Corporation, Armonk, NY (US)

(72) Inventors: Zlatko Kristev Minev, White Plains, NY (US); Thomas George McConkey, White Plains, NY (US); Jay Michael Gambetta, Yorktown Heights, NY (US)

(73) Assignee: INTERNATIONAL BUSINESS MACHINE CORPORATION, Armonk, NY (US)

( * ) Notice: Subject to any disclaimer, the term of this patent is extended or adjusted under 35 U.S.C. 154(b) by 1085 days.

(21) Appl. No.: 16/942,239

(22) Filed: Jul. 29, 2020

(65) Prior Publication Data
US 2022/0036226 A1   Feb. 3, 2022

(51) Int. Cl.
*G06N 10/00*    (2022.01)
*G06F 30/20*    (2020.01)
*G06N 10/20*    (2022.01)

(52) U.S. Cl.
CPC ............ *G06N 10/00* (2019.01); *G06F 30/20* (2020.01); *G06N 10/20* (2022.01)

(58) Field of Classification Search
None
See application file for complete search history.

(56) References Cited

U.S. PATENT DOCUMENTS

| 10,140,404 | B2 | 11/2018 | Rigetti et al. |
| 2019/0236218 | A1 | 8/2019 | Paik et al. |
| 2019/0370430 | A1 | 12/2019 | Jeffrey et al. |
| 2020/0134503 | A1* | 4/2020 | Lupton .................. G06N 5/01 |

OTHER PUBLICATIONS

Maron, Adriano, Renata Reiser, and Maurício Pilla. "High-performance quantum computing simulation for the quantum geometric machine model." 2013 13th IEEE/ACM International Symposium on Cluster, Cloud, and Grid Computing. IEEE, 2013. (Year: 2013).*

Maron, Adriano K., et al. "Distributed Quantum Simulation on the VPE-qGM Environment." 2010 11th Symposium on Computing Systems. (Year: 2010).*

(Continued)

*Primary Examiner* — Daniel T Pellett
(74) *Attorney, Agent, or Firm* — Amin, Turocy & Watson, LLP

(57) ABSTRACT

Systems, computer-implemented methods, and computer program products to facilitate translation of a quantum design across multiple applications are provided. According to an embodiment, a system can comprise a memory that stores computer executable components and a processor that executes the computer executable components stored in the memory. The computer executable components can comprise a quantum library component that stores a data structure representing a quantum geometry that is a physical representation of a quantum element in a quantum component. The computer executable components can further comprise a quantum renderer component that translates the quantum geometry into a defined format of an application based on the data structure.

20 Claims, 11 Drawing Sheets

(56) References Cited

OTHER PUBLICATIONS

Maron, Adriano, et al. "Expanding the VPE-qGM Environment Towards a Parallel Quantum Simulation of Quantum Processes Using GPUs." CLEI Electronic Journal 16.3 (2013): 3-3. (Year: 2013).*

Maron, A. K., et al. "Quantum processes: a novel optimization for quantum simulation." TEMA (São Carlos) 14 (2013): 399-414. (Year: 2013).*

Reiser, Renata Hax Sander, Antonio Carlos da Rocha Costa, and Graçaliz Pereira Dimuro. "First steps in the construction of the geometric machine model." Trends in Computational and Applied Mathematics 3.1 (2002): 183-192. (Year: 2002).*

Reiser, Renata Hax Sander, and António Carlos da Rocha Costa. "Programming in the Quantum Geometric Machine.".*

Schmalfuss, Murilo, et al. "qGMC-Analyzer—Quantum Simulation on Multicore Architectures." 2013 2nd Workshop—School on Theoretical Computer Science. IEEE, 2013. (Year: 2013).*

Mell et al., "The NIST Definition of Cloud Computing," Recommendations of the National Institute of Standards and Technology, NIST Special Publication 800-145, Sep. 2011, 7 pages.

Lin et al., "PAQCS: Physical Design-Aware Fault-Tolerant Quantum Circuit Synthesis," IEEE Transactions on Very Large Scale Integration (VLSI) Systems, 2014, 14 pages.

* cited by examiner

TRANSLATION OF A QUANTUM DESIGN ACROSS MULTIPLE APPLICATIONS

BACKGROUND

The subject disclosure relates to design and management of quantum circuits, and more specifically, to translation of a quantum design across multiple applications.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate translation of a quantum design across multiple applications are described.

According to an embodiment, a system can comprise a memory that stores computer executable components and a processor that executes the computer executable components stored in the memory. The computer executable components can comprise a quantum library component that stores a data structure representing a quantum geometry that is a physical representation of a quantum element in a quantum component. The computer executable components can further comprise a quantum renderer component that translates the quantum geometry into a defined format of an application based on the data structure.

According to another embodiment, a computer-implemented method can comprise storing, by a system operatively coupled to a processor, a data structure representing a quantum geometry that is a physical representation of a quantum element in a quantum component. The computer-implemented method can further comprise translating, by the system, the quantum geometry into a defined format of an application based on the data structure.

According to another embodiment, a computer program product facilitating a quantum design translation process is provided. The computer program product comprising a computer readable storage medium having program instructions embodied therewith, the program instructions executable by a processor to cause the processor to store, by the processor, a data structure representing a quantum geometry that is a physical representation of a quantum element in a quantum component. The program instructions are further executable by the processor to cause the processor to translate, by the processor, the quantum geometry into a defined format of an application based on the data structure.

DETAILED DESCRIPTION

Figure 1:
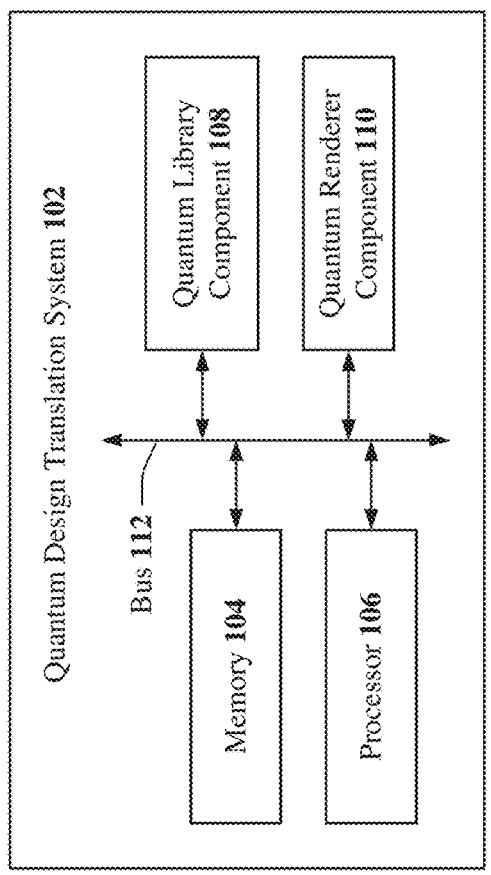
FIG. 1 illustrates a block diagram of an example, non-limiting system that can facilitate translation of a quantum design across multiple applications in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Generating a functioning quantum bit (qubit) chip involves multiple steps which currently can have slow feedback and translation between each step. Many work hours can be spent in the manual generation of quantum circuit and/or qubit chip designs. A variety of professional software applications (also referred to herein as applications) are used during the design, simulation, analysis, fabrication, and/or testing of a circuit layout of a quantum chip. Converting designs between such software applications can be time consuming and error prone. This time will foreseeably grow exponentially with greater number of qubits and larger chips. Example bottleneck steps (e.g., sources of time loss) in the design, simulation, analysis, fabrication, and/or testing of a circuit layout of a quantum chip include, but are not limited to: manual drawing of common structures (e.g., a coplanar waveguide (CPW), a qubit, a connector (e.g., a CPW launcher), etc.); ensuring no collisions between circuits, bump bonds, and/or flip chips; and/or converting of file types (e.g., design files, simulation files, analysis files, fabrication files, etc.), as straight import results in suboptimal meshing and/or simulation, such that many circuits involve redrawing in native objects of a target software application.

As described herein, various embodiments of the subject disclosure can be implemented to design and manage quantum circuits (e.g., electrical and/or microwave circuits), such as superconducting qubits or photonics. These embodiments can enable programmatic design of quantum circuits (e.g., simple and/or complex quantum circuits) via a library of user-definable quantum components (which shall be referred to herein as "QComponents") and quantum geometries (which shall be referred to herein as "QGeometries"), where such quantum circuits are referred to herein as quantum designs (which shall be referred to herein as "QDesigns"). Further, these embodiments can act as a translational system for designs between different software applications used in the community (e.g., different software applications used in quantum design, simulation, fabrication, testing, etc.). For example, these embodiments can render a user design or, if desired, a subset of design components natively into a simulation software (e.g., an electromagnetic (EM) and/or simulation application). As referenced herein, a user can denote an entity that can implement the subject disclosure in accordance with one or more embodiments described herein, where such an entity can include, but is not limited to, a human, a client, a user, a computing device, a software application, an agent, a machine learning model, an artificial intelligence model, and/or another entity.

The various embodiments of the subject disclosure can also set appropriate features, such as meshing and boundary conditions to optimize the simulation of the circuit. These embodiments can then initiate a simulation and fetch and process the results to obtain user-requested parameters. In addition, the various embodiments of the subject disclosure can render a QDesign directly to a design and/or fabrication file along with appropriate additional features, such as the bridge for the junctions, which can then be used to generate a mask for fabrication of an integrated circuit (IC) comprising the QDesign. Practically, the embodiments of the subject disclosure can be implemented using an application programming interface (API) and/or through a front-end graphical user interface (GUI). It should be appreciated that the various embodiments of the subject disclosure can constitute a quantum equivalent of classical Very-Large-Scale Integration (VLSI).

As referenced herein, the terms below can be defined as follows:

QDesign—a class that represents an overall quantum chip, which can be a simple single layer single chip system to a multilayer flip chip system. A QDesign can comprise one or more QComponents, where each QComponent can comprise a collection of QGeometries.

QComponent—a class that represents a physical quantum device circuit (e.g., a transmon qubit, a CPW resonator, a bump bond, etc.). A QComponent can comprise relevant design values for the QComponent that can be set by the designer of the QComponent. Using specified options and logic, a QComponent implemented in accordance with one or more embodiments of the subject disclosure described herein can also dynamically create its QGeometry.

QGeometry—a data structure and associated methods that represent QComponent geometric primitives and their properties. Primitives can include, but are not limited to, polygons, paths, curved shapes, quantum primitives (e.g., Josephson junctions, etc.), and/or another primitive. Properties can include, but are not limited to, material, boundary condition, inductance, resistance, thickness, mesh operations, quantum properties, and/or another property. In accordance with one or more embodiments of the subject disclosure described herein, such properties can be extended by a quantum renderer (which shall be referred to herein as "QRenderer") to specify how they are to be translated into and/or rendered in a software application. As described herein, an embodiment of a QGeometry can be, for example, a set of class instances or as a set of data tables. A QGeometry can have built-in functionality to handle, for example, intersections, collision detection, and/or bounding boxes.

QRenderer—a class that operates as a translator between a QDesign and a software application to which a user wants to export their QDesign. A QRenderer differs from a standard import of a design file (e.g., a design file, a fabrication file, etc.) by natively generating a QDesign in the software application such that it is automatically setup for simulation, editing, and/or fabricating in an optimal manner In accordance with various embodiments of the subject disclosure described herein, a QRenderer can run simulations of a QDesign, retrieve simulation data, and/or link up with a quantum analysis (QAnalysis) module.

Front-End User (also referred to herein as a front-end entity)—a user (e.g., an entity as defined above) that makes use of a front-end GUI of the subject disclosure or that writes simple code (e.g., via a Jupyter notebook) to design layouts (e.g., QDesigns) for simulation and/or fabrication. In accordance with one or more embodiments of the subject disclosure, the front-end user can accomplish this by making use of one or more libraries described herein (e.g., QComponent libraries, QDesign libraries, QRenderer libraries, Analysis libraries, etc.). Such a front-end user has no knowledge on how these libraries function and can be completely isolated from the running of any external software application (e.g., an electromagnetic and/or simulation application), instead simply requesting an analysis in accordance with one or more embodiments of the subject disclosure. In some embodiments, the front-end user can create a layout (e.g., a QDesign) via a QComponent library of the subject disclosure. In these embodiments, the front-end user can request an analysis (e.g., an energy participation ratio (EPR), etc.) from a system of the subject disclosure and indicate which EM software application is present on their system. The front-end user can then implement the subject disclosure in accordance with one or more embodiments described herein to: render a QDesign natively and optimally into the EM software application (e.g., turning any QGeometry into an appropriate alternative representation for such a simulation and/or analysis); run the simulation (e.g., an eigenmode solution); extract the results back into a system of the subject disclosure; and/or present the results of the chosen analysis. In these one or more embodiments, if happy with the results, the front-end user can then render the layout (e.g., the QDesign) into a format suitable for fabrication.

Creator User and/or QComponent Designer—a user (e.g., an entity as defined above) that can create QComponents to be added to a QComponent library of the subject disclosure in accordance with one or more embodiments described herein. This user has an intermediate knowledge of coding and functional knowledge of the code that can be used to implement one or more embodiments of the subject disclosure as described herein. They can, however, be ignorant as to QRenderer and Analysis libraries of the subject disclosure and, in some embodiments, only provide code for the geographical structure of QComponents they design. In some embodiments, this user can further provide the appropriate indications of which QComponents will have alternative representations (e.g., a transmon qubit layout with the junction (e.g., Josephson junction) being flagged so a QRenderer recognizes it and provides the appropriate alternative representation).

Plugin Developer—this developer can write new code for QRenderer and/or Analysis libraries of the subject disclosure in accordance with one or more embodiments of the subject disclosure. The plugin developer has expert knowledge of coding, the software and/or analysis method for which they are writing a QRenderer and/or an Analysis of the subject disclosure, and a good understanding of the quantum behavior of the relevant circuits (e.g., the quantum behavior of various QGeometries, QComponents, and/or QDesigns). In some embodiments, it is the plugin developer that recognizes what the appropriate alternative representation is for a quantum circuit (e.g., a QDesign) given a particular QRenderer and/or analysis.

Following on the example above from the front-end user, in some embodiments, the plugin developer can write code for a QRenderer of the subject disclosure such that it recognizes a flag for a Josephson junction element in a transmon qubit and represents it in an eigenmode simulation as a 2-dimensional (2D) square sheet with a resistor inductor capacitor (RLC) circuit boundary (RLC boundary) set to the inductance value as given by the front-end user (e.g., based on what frequency the ground state of the qubit is to be).

FIG. 1 illustrates a block diagram of an example, non-limiting system 100 that can facilitate translation of a quantum design across multiple applications in accordance with one or more embodiments described herein. System 100 can comprise a quantum design translation system 102, which can be associated with a cloud computing environment. For example, quantum design translation system 102 can be associated with cloud computing environment 950 described below with reference to FIG. 9 and/or one or more functional abstraction layers described below with reference to FIG. 10 (e.g., hardware and software layer 1060, virtualization layer 1070, management layer 1080, and/or workloads layer 1090).

Quantum design translation system 102 and/or components thereof (e.g., quantum library component 108, quantum renderer component 110, etc.) can employ one or more computing resources of cloud computing environment 950 described below with reference to FIG. 9 and/or one or more functional abstraction layers (e.g., quantum software, etc.) described below with reference to FIG. 10 to execute one or more operations in accordance with one or more embodiments of the subject disclosure described herein. For example, cloud computing environment 950 and/or such one or more functional abstraction layers can comprise one or more classical computing devices (e.g., classical computer, classical processor, virtual machine, server, etc.), quantum hardware, and/or quantum software (e.g., quantum computing device, quantum computer, quantum processor, quantum circuit simulation software, superconducting circuit, etc.) that can be employed by quantum design translation system 102 and/or components thereof to execute one or more operations in accordance with one or more embodiments of the subject disclosure described herein. For instance, quantum design translation system 102 and/or components thereof can employ such one or more classical and/or quantum computing resources to execute one or more classical and/or quantum: mathematical function, calculation, and/or equation; computing and/or processing script; algorithm; model (e.g., artificial intelligence (AI) model, machine learning (ML) model, etc.); and/or another operation in accordance with one or more embodiments of the subject disclosure described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:
  Private cloud: the cloud infrastructure is operated solely for an organization. It may be managed by the organization or a third party and may exist on-premises or off-premises.
  Community cloud: the cloud infrastructure is shared by several organizations and supports a specific community that has shared concerns (e.g., mission, security requirements, policy, and compliance considerations). It may be managed by the organizations or a third party and may exist on-premises or off-premises.
  Public cloud: the cloud infrastructure is made available to the general public or a large industry group and is owned by an organization selling cloud services.
  Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Returning now to FIG. 1, quantum design translation system 102 can comprise a memory 104, a processor 106, a quantum library component 108, a quantum renderer component 110, and/or a bus 112.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100 and/or quantum design translation system 102 can further comprise various computer and/or computing-based elements described herein with reference to operating environment 800 and FIG. 8. In several embodiments, such computer and/or computing-based elements can be used in connection with implementing one or more of the systems, devices, components, and/or computer-implemented operations shown and described in connection with FIG. 1 or other figures disclosed herein.

Memory 104 can store one or more computer and/or machine readable, writable, and/or executable components and/or instructions that, when executed by processor 106 (e.g., a classical processor, a quantum processor, etc.), can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to quantum design translation system 102, quantum library component 108, quantum renderer component 110, and/or another component associated with quantum design translation system 102 as described herein with or without reference to the various figures of the subject disclosure.

Memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 816 and FIG. 8. Such examples of memory 104 can be employed to implement any embodiments of the subject disclosure.

Processor 106 can comprise one or more types of processors and/or electronic circuitry (e.g., a classical processor, a quantum processor, etc.) that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, quantum processor, and/or another type of processor. Further examples of processor 106 are described below with reference to processing unit 814 and FIG. 8. Such examples of processor 106 can be employed to implement any embodiments of the subject disclosure.

Quantum design translation system 102, memory 104, processor 106, quantum library component 108, quantum renderer component 110, and/or another component of quantum design translation system 102 as described herein can be communicatively, electrically, operatively, and/or optically coupled to one another via a bus 112 to perform functions of system 100, quantum design translation system 102, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 818 and FIG. 8. Such examples of bus 112 can be employed to implement any embodiments of the subject disclosure.

Quantum design translation system 102 can comprise any type of component, machine, device, facility, apparatus, and/or instrument that comprises a processor and/or can be capable of effective and/or operative communication with a wired and/or wireless network. All such embodiments are envisioned. For example, quantum design translation system 102 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Quantum design translation system 102 can be coupled (e.g., communicatively, electrically, operatively, optically, etc.) to one or more external systems, sources, and/or devices (e.g., classical and/or quantum computing devices, communication devices, etc.) via a data cable (e.g., High-Definition Multimedia Interface (HDMI), recommended standard (RS) 232, Ethernet cable, etc.). In some embodiments, quantum design translation system 102 can be coupled (e.g., communicatively, electrically, operatively, optically, etc.) to one or more external systems, sources, and/or devices (e.g., classical and/or quantum computing devices, communication devices, etc.) via a network.

In some embodiments, such a network can comprise wired and wireless networks, including, but not limited to, a cellular network, a wide area network (WAN) (e.g., the Internet) or a local area network (LAN). For example, quantum design translation system 102 can communicate with one or more external systems, sources, and/or devices, for instance, computing devices (and vice versa) using virtually any desired wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example, quantum design translation system 102 can thus include hardware (e.g., a central processing unit (CPU), a transceiver, a decoder, quantum hardware, a quantum processor, etc.), software (e.g., a set of threads, a set of processes, software in execution, quantum pulse schedule, quantum circuit, quantum gates, etc.) or a combination of hardware and software that facilitates communicating information between quantum design translation system 102 and external systems, sources, and/or devices (e.g., computing devices, communication devices, etc.).

Quantum design translation system 102 can comprise one or more computer and/or machine readable, writable, and/or executable components and/or instructions that, when executed by processor 106 (e.g., a classical processor, a quantum processor, etc.), can facilitate performance of operations defined by such component(s) and/or instruction(s). Further, in numerous embodiments, any component associated with quantum design translation system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, quantum library component 108, quantum renderer component 110, and/or any other components associated with quantum design translation system 102 as disclosed herein (e.g., communicatively, electronically, operatively, and/or optically coupled with and/or employed by quantum design translation system 102), can comprise such computer and/or machine readable, writable, and/or executable component(s) and/or instruction(s). Consequently, according to numerous embodiments, quantum design translation system 102 and/or any components associated therewith as disclosed herein, can employ processor 106 to execute such computer and/or machine readable, writable, and/or executable component(s) and/or instruction(s) to facilitate performance of one or more operations described herein with reference to quantum design translation system 102 and/or any such components associated therewith.

Quantum design translation system 102 can facilitate (e.g., via processor 106) performance of operations executed by and/or associated with quantum library component 108, quantum renderer component 110, and/or another component associated with quantum design translation system 102 as disclosed herein. For example, as described in detail below, quantum design translation system 102 can facilitate via processor 106 (e.g., a classical processor, a quantum processor, etc.): store a data structure representing a quantum geometry that is a physical representation of a quantum element in a quantum component; and/or translate the quantum geometry into a defined format of an application based on the data structure.

In another example, as described in detail below, quantum design translation system 102 can further facilitate (e.g., via processor 106): render a visualization of at least one of the quantum geometry or the quantum component in the application at runtime of the application based on the data structure; perform at least one of a translation of a second quantum geometry into a second defined format of a second application or a rendering of a visualization of the second quantum geometry in the second application, wherein the second quantum geometry comprises a modified version of the quantum geometry; perform at least one of a translation of the quantum geometry into the defined format of the application or a rendering of a visualization of the quantum geometry in the application based on one or more attributes of the application that indicate how at least one of a geometric primitive or a property of the quantum geometry is to be respectively translated into the defined format of the application or rendered in the application; and/or perform at least one of a translation into the defined format of the application or a rendering of a visualization in the application of a quantum design representing a quantum circuit comprising at least one of the quantum geometry or the quantum component and employ the application to perform at least one of a simulation or an analysis of at least one of the quantum geometry, the quantum component, or the quantum design.

In another example, as described in detail below, quantum design translation system 102 can further facilitate (e.g., via processor 106): perform at least one of a translation of the quantum geometry into the defined format of the application or a rendering of a visualization of the quantum geometry in the application to facilitate at least one of: reduced time in designing, simulating, fabricating, and testing a quantum device; elimination of one or more redundant operations performed in designing, simulating, fabricating, and testing the quantum device; improved performance of one or more processors executing one or more operations of the application; or reduced computational costs of the one or more processors in executing the one or more operations of the application. In the above examples, the data structure can represent at least one of a geometric primitive of the quantum geometry or a property of the quantum geometry, and/or the quantum geometry can comprise a variable physical representation of the quantum element in the quantum component.

Quantum library component 108 can store a data structure representing a quantum geometry (QGeometry) that is a physical representation of a quantum element in a quantum component (QComponent). In various embodiments, such a QGeometry can comprise a geometric representation of one or more design objects that can physically exist in the real world and/or one or more simplified geometric models of such real-world object(s) that can be used for simulation purposes. In some embodiments, such a QGeometry can comprise a data structure and/or one or more associated methods (e.g., command(s) that can operate on the QGeometry and/or the data structure) that can represent QComponent geometric primitives and their properties. For example, quantum library component 108 can store a data structure representing a geometric primitive of the QGeometry, where such a geometric primitive can include, but is not limited to, a polygon, a path, a curve, and/or another geometric primitive. In another example, quantum library component 108 can store a data structure representing a property of the QGeometry, where such a property can include, but is not limited to, a material, a boundary condition, an inductance, a resistance, a thickness, a mesh operation, a quantum property, and/or another property. In various embodiments, the above QComponent can comprise a class that represents a physical quantum device circuit (e.g., a qubit (e.g., a transmon qubit), a CPW (e.g., a CPW resonator), a connector (e.g., a CPW launcher), a bump bond, etc.) and can have relevant design values for the QComponent.

In an embodiment, the QGeometry above can comprise a set of class instances. In another embodiment, such a QGeometry can comprise a set of data tables. In still another embodiment, such a QGeometry can have built-in functionality to handle, for example, intersections, collision detection, and/or bounding boxes. In some embodiments, the QGeometry can further comprise a variable physical representation of a quantum element in a QComponent (e.g., a variable representation dependent on the representational space (e.g., certain target software application(s)) the QGeometry and/or QComponent will be translated into and/or rendered in as described below.

In some embodiments, such QGeometry, data structure, and/or associated method(s) described above can be organized in and/or formatted as a data table such as, for instance, a QGeometry table and/or a quantum table. In these embodiments, such a QGeometry table and/or quantum table can specify information to represent a QGeometry as a variable representation dependent on the representational space (e.g., a variable representation dependent on the software application the QGeometry and/or QComponent will be translated into and/or rendered in as described below). In some embodiments, such a QGeometry table, QGeometry, data structure, and/or associated method(s) can be organized in and/or formatted as a data handler such as, for instance, a QGeometry handler.

In some embodiments, quantum library component 108 can comprise a database and/or a memory device (e.g., memory 104, a memory device external to quantum design translation system 102, etc.) that can store the data structure representing the QGeometry defined above and/or the methods associated with the data structure and/or the QGeometry (e.g., command(s) that can operate on the QGeometry and/or the data structure). Additionally, or alternatively, in some embodiments, quantum library component 108 can comprise a database and/or a memory device (e.g., memory 104, a memory device external to quantum design translation system 102, etc.) that can store the QGeometry, quantum table, and/or QGeometry handler described above that can comprise the data structure representing the QGeometry defined above and/or the methods associated with the data structure and/or the QGeometry (e.g., command(s) that can operate on the QGeometry and/or the data structure).

In accordance with one or more embodiments of the subject disclosure described herein, such properties defined above can be extended by a quantum renderer (QRenderer) to specify how they are to be translated into and/or rendered in a certain software application and/or in different software applications.

Quantum renderer component 110 can translate the QGeometry described above into a defined format of one or more applications based on (e.g., using) the above described data structure. To facilitate such translation, in some embodiments, quantum renderer component 110 can comprise a compiler (e.g., a multi-target layout compiler, a source-to-source compiler, a transpiler, cross-compiler, bootstrap compiler, decompiler, etc.) that can translate the QGeometry described above into a defined format of one or more applications based on (e.g., using) the above described data structure. In some embodiments, such a defined format can include, but is not limited to, a native format, a file format, a file type, and/or another format of an application. In these embodiments, such an application can include, but is not limited to: a design application (e.g., an application used to design a quantum circuit); a simulation application (e.g., an application used to simulate operation of a quantum circuit such as, for instance, an application used to perform electromagnetic simulation of the quantum circuit); an analysis application; a fabrication application (e.g., an application used to generate an integrated circuit comprising a quantum circuit); a testing application (e.g., an application used to test a quantum circuit formed as an integrated circuit on a substrate); and/or another application.

In various embodiments, quantum renderer component 110 can render a visualization of the above described QGeometry and/or QComponent in one or more of the applications defined above at runtime of such one or more applications based on (e.g., using) the data structure defined above. In some embodiments, to facilitate such rendering, quantum renderer component 110 can directly control an application defined above using inter-process communication in the application during runtime to render (e.g., draw) a visualization of the QGeometry and/or QComponent described above in the application. In these embodiments, to facilitate such rendering (e.g., drawing) of such a visualization of the QGeometry and/or QComponent described above in an application, quantum renderer component 110 can use a binary-interface standard for software components such as, for instance, the Component Object Model (COM) API.

In numerous embodiments, quantum renderer component 110 can translate (e.g., via a compiler as described above) a quantum design (QDesign) into a defined format (e.g., a native format, a file format, a file type, etc.) of one or more applications defined above and/or render (e.g., via the COM API) a visualization of the QDesign in such one or more applications. In these embodiments, such a QDesign can represent a quantum circuit comprising QGeometry and/or the QComponent described above. In these embodiments, quantum renderer component 110 can further employ the application to perform a simulation and/or an analysis of the QGeometry, the QComponent, and/or the QDesign. In these embodiments, based on results data of such a simulation and/or analysis of the QGeometry, the QComponent, and/or the QDesign, an entity (e.g., an entity as defined herein) implementing quantum design translation system 102 can modify (e.g., via a GUI and/or another interface component of quantum design translation system 102) the QGeometry, the QComponent, and/or the QDesign such that they comprise and/or account for the results data of the simulation and/or analysis.

In some embodiments, quantum renderer component 110 can translate (e.g., via a compiler as described above) a second QGeometry comprising a modified version of the QGeometry into a second defined format (e.g., a native format, a file format, a file type, etc.) of a second application and/or render a visualization of the second QGeometry in the second application. For example, in the embodiments described above, based on such modification of the QGeometry, the QComponent, and/or the QDesign, quantum renderer component 110 can translate (e.g., via a compiler as described above) the modified version of the QGeometry into a second defined format (e.g., a native format, a file format, a file type, etc.) of a second application and/or render a visualization of the modified version of the QGeometry in the second application. In this example, such a modified version of the QGeometry can comprise and/or account for the results data obtained from performing the simulation and/or analysis on the QGeometry, the QComponent, and/or the QDesign. In this example, such a second application can comprise, for instance, a fabrication application used to generate an integrated circuit comprising the QGeometry, the QComponent, and/or the QDesign.

In some embodiments, quantum renderer component 110 can translate (e.g., via a compiler as described above) a QGeometry into a defined format (e.g., a native format, a file format, a file type, etc.) of one or more applications defined above and/or render (e.g., via the COM API) a visualization of the QGeometry in such one or more applications based on one or more attributes of the application. For example, quantum renderer component 110 can translate a QDesign into a defined format of one or more applications defined above and/or render a visualization of the QDesign in such one or more applications based on one or more attributes of the application that indicate how a geometric primitive and/or a property of the QGeometry is to be respectively translated into the defined format of the application or rendered in the application.

In the embodiments described above, quantum renderer component 110 can translate (e.g., via a compiler as described above) the QGeometry into a defined format (e.g., a native format, a file format, a file type, etc.) of an application and/or render (e.g., via the COM API) a visualization of the QGeometry in the application to facilitate at least one of: reduced time in designing, simulating, fabricating, and testing a quantum device; elimination of one or more redundant operations performed in designing, simulating, fabricating, and testing the quantum device; improved performance of one or more processors executing one or more operations of the application; or reduced computational costs of the one or more processors in executing the one or more operations of the application.

In the embodiments described above, it should be appreciated that quantum design translation system 102 can provide a pseudo-standardized data structure that can be employed to generate a qubit circuit layout across various software applications using a multi-target layout compiler (e.g., quantum renderer component 110). In these embodiments, quantum design translation system 102 and/or quantum renderer component 110 can employ one or more quantum renderers (QRenderers) and/or QGeometries to compile into one or more applications of an entity's choice (e.g., an entity as defined herein that implements quantum design translation system 110) one or more quantum circuit designs (e.g., QDesigns) that can be generated natively in the one or more applications by quantum renderer component 110. In these embodiments, this can be accomplished through the pairing of QGeometries and QRenderers, where such QGeometries can comprise the relevant parameters that enable a QRenderer to compile the equivalent of the QGeometry into the desired application(s) natively, with any additional features that are appropriate for the application(s). In these embodiments, the QGeometry can be created via a make function in each QComponent based on the entity's inputted parameters and/or values from a default dictionary.

In the embodiments described above, it should be appreciated that quantum design translation system 102 can be implemented to facilitate a programmatic and/or automated design process of a quantum device (e.g., a quantum chip, an integrated circuit comprising a quantum circuit, etc.). In these embodiments, via a library of QComponents that can be generated by, for instance, a creator user and/or component designer as defined above, a front-end user (e.g., a front-end entity defined above) can generate a large quantum circuit and simulate it in the application of their choice via one or more QRenderers that can be generated by, for example, a plugin developer as defined above. In these embodiments, simulation results can then be further analyzed (e.g., via quantum design translation system 102) as requested by the front-end user. In these embodiments, quantum renderer component 110 can then render the QDesign to a file type for fabrication.

Quantum design translation system 102 can facilitate one or more of the operations described in the embodiments above by using module structures that can follow techniques such as, for instance, dependency inversion principle (DIP) and/or dependency injection (DI). Quantum design translation system 102 can use such model structures that can follow such techniques to provide flexible and/or forward-compatible interface(s) that can be modified, specialized, and abstracted at a later time without breaking downstream dependencies, thereby relaxing hardcoded internal API dependencies. Therefore, it should be appreciated that quantum design translation system 102 is flexible in that it can allow late, runtime bindings.

Figure 2:
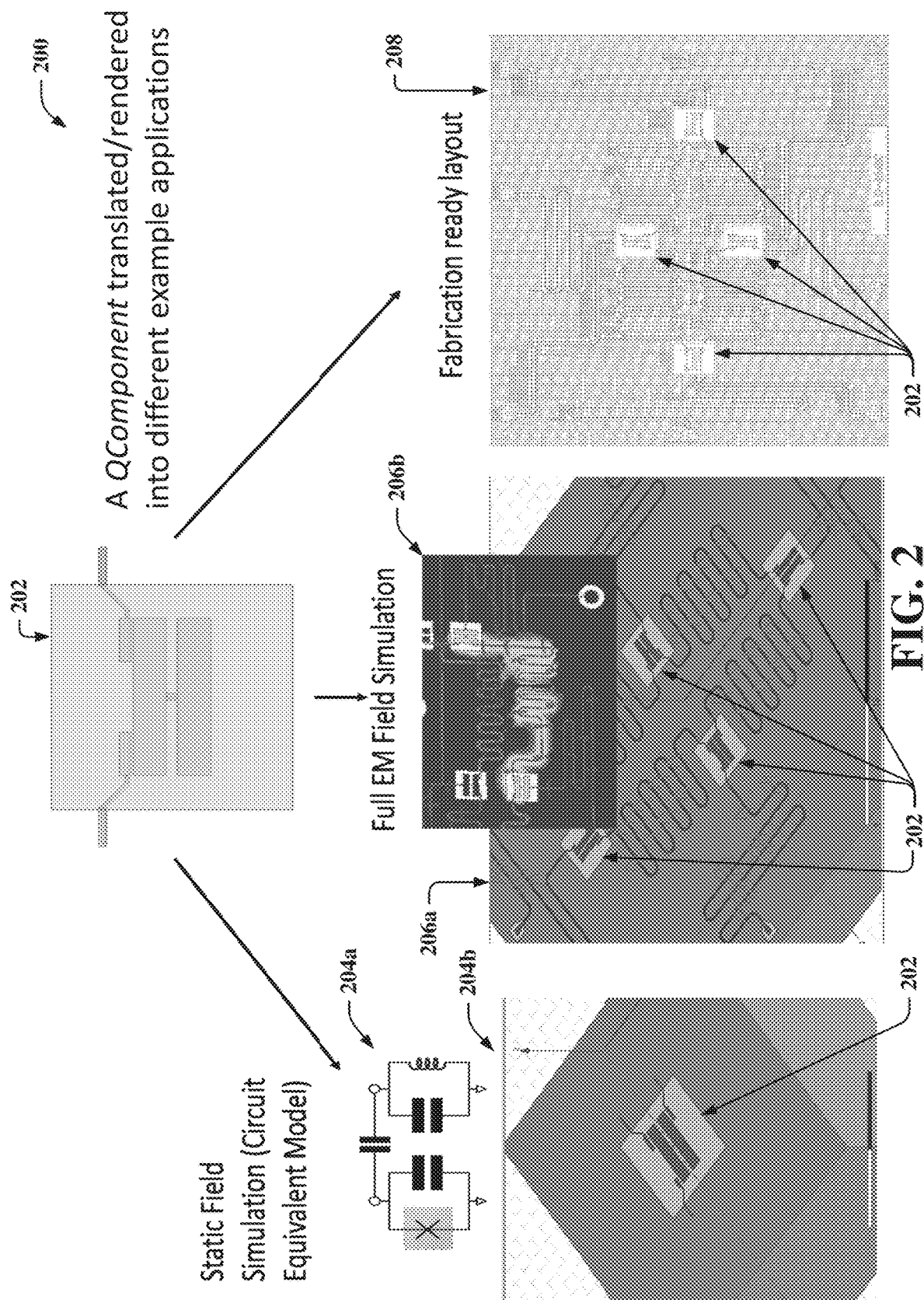
FIG. 2 illustrates an example, non-limiting diagram that can facilitate translation of a quantum design across multiple applications in accordance with one or more embodiments described herein.

FIG. 2 illustrates an example, non-limiting diagram 200 that can facilitate translation of a quantum design across multiple applications in accordance with one or more embodiments described herein. Repetitive description of like elements and/or processes employed in respective embodiments is omitted for sake of brevity.

Diagram 200 illustrates a QComponent 202 that can be translated into a defined format of different applications and/or rendered in such applications using quantum design translation system 102. In the example embodiment illustrated in FIG. 2, QComponent 202 comprises a qubit (e.g., a transmon qubit). As described above with reference to FIG. 1, quantum library component 108 can store QComponent 202, which can be generated by an entity as defined herein that implements quantum design translation system 102 using various QGeometries that can also be stored in quantum library component 108. As described above with reference to FIG. 1 and as illustrated in the example embodiment depicted in FIG. 2, quantum renderer component 110 can translate QComponent 202 into a defined format of different applications and/or render QComponent 202 in such applications.

As illustrated in the example embodiment depicted in FIG. 2, quantum renderer component 110 can translate (e.g., via a compiler as described above) QComponent 202 into a defined format (e.g., a native format, a file format, a file type, etc.) of a static field simulation application. In this embodiment, quantum renderer component 110 can further render QComponent 202 in the static field simulation application as a visualization 204a comprising a circuit equivalent model and/or a visualization 204b comprising an isometric view of QComponent 202 on a substrate, where quantum renderer component 110 can generate visualizations 204a, 204b in the static field simulation application as described above with reference to FIG. 1 (e.g., via the COM API).

As illustrated in the example embodiment depicted in FIG. 2, quantum renderer component 110 can translate (e.g., via a compiler as described above) QComponent 202 into a defined format (e.g., a native format, a file format, a file type, etc.) of a full electromagnetic (EM) field simulation application. In this embodiment, quantum renderer component 110 can further render QComponent 202 in the full EM field simulation application as a visualization 206a comprising an isometric view of a quantum circuit having multiple QComponents 202 on a substrate and/or a visualization 206b illustrating a simulated operation of the quantum circuit where an electromagnetic field radiates from QComponent 202 and a CPW (e.g., a CPW resonator) of the quantum circuit. In this embodiment, quantum renderer component 110 can generate visualizations 206a, 206b in the full EM field simulation application as described above with reference to FIG. 1 (e.g., via the COM API).

As illustrated in the example embodiment depicted in FIG. 2, quantum renderer component 110 can translate (e.g., via a compiler as described above) QComponent 202 into a defined format (e.g., a native format, a file format, a file type, etc.) of a fabrication application. In this embodiment, quantum renderer component 110 can further render QComponent 202 in the fabrication application as a visualization 208 comprising a top view of a quantum circuit having multiple QComponents 202 on a substrate, where visualization 208 can comprise a fabrication ready layout of the quantum circuit that can be used to fabricate the quantum circuit as an integrated circuit formed on a substrate. In this embodiment, quantum renderer component 110 can generate visualization 208 in the fabrication application as described above with reference to FIG. 1 (e.g., via the COM API).

Figure 3:
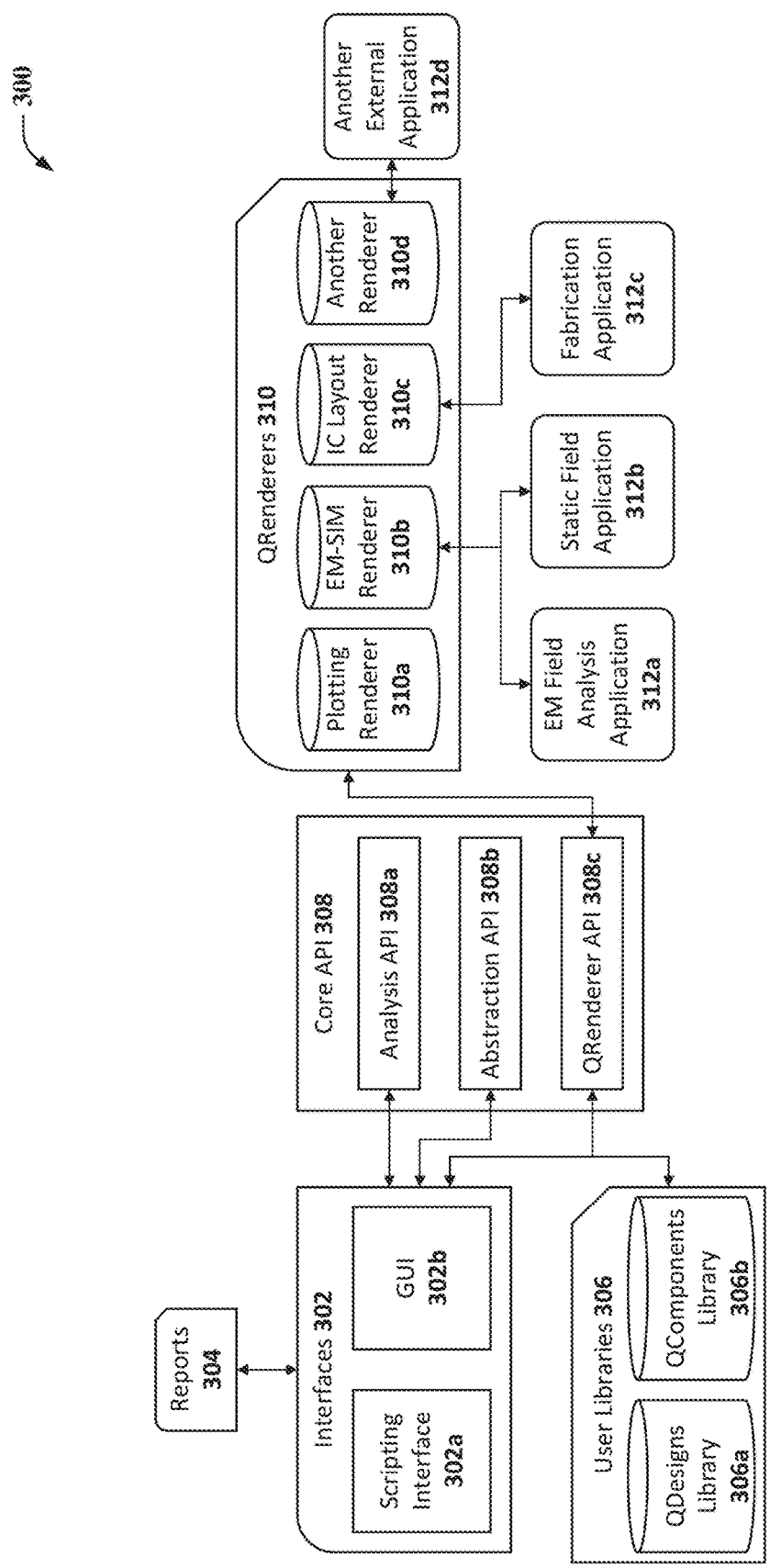
FIG. 3 illustrates a block diagram of an example, non-limiting system that can facilitate translation of a quantum design across multiple applications in accordance with one or more embodiments described herein.

FIG. 3 illustrates a block diagram of an example, non-limiting system 300 that can facilitate translation of a quantum design across multiple applications in accordance with one or more embodiments described herein. Repetitive description of like elements and/or processes employed in respective embodiments is omitted for sake of brevity.

In some embodiments, system 300 can comprise an example, non-limiting alternative embodiment of system 100. As illustrated in the example embodiment depicted in FIG. 3, system 300 can comprise interfaces 302 that can include, but are not limited to, a scripting interface 302a (e.g., Jupyter Notebook) and/or a GUI 302b. In this embodiment, an entity as defined herein that implements quantum design translation system 102 can use scripting interface 302a and/or GUI 302b to define (e.g., create) one or more QGeometries, QComponents, and/or QDesigns. In this embodiment, such an entity can further use scripting interface 302a and/or GUI 302b to define one or more parameters associated with such one or more QGeometries, QComponents, and/or QDesigns. In this embodiment, the QDesign(s) can comprise the QComponent(s), and the QComponent(s) can comprise the one or more QGeometries.

In the example embodiment illustrated in FIG. 3, to define such one or more QGeometries, QComponents, QDesigns, and/or associated parameters described above, such an entity can use scripting interface 302a and/or GUI 302b to access one or more API's of core API 308. For example, to define such one or more QGeometries, QComponents, QDesigns, and/or associated parameters described above, such an entity can use scripting interface 302a and/or GUI 302b to access abstraction API 308b illustrated in FIG. 3. In this example, abstraction API 308b can comprise one or more data structures and/or associated methods (e.g., command(s)) that can operate on a QGeometry and/or a data structure) that can be used to define such one or more QGeometries, QComponents, QDesigns, and/or associated parameters described above. Additionally, or alternatively, in this example, such an entity can further use scripting interface 302a and/or GUI 302b to access analysis API 308a of core API 308. In this example, analysis API 308a can comprise one or more functions that can be implemented by such an entity to, for instance, analysis such one or more QGeometries, QComponents, QDesigns, and/or associated parameters that can be defined by the entity as described above.

In the example embodiment illustrated in FIG. 3, an entity as defined herein that implements quantum design translation system 102 can further use scripting interface 302a and/or GUI 302b to input into and/or receive from quantum design translation system 102 one or more reports 304. In this embodiment, such one or more reports 304 can comprise, for instance, results data from a simulation of a QGeometry, a QComponent, and/or a QDesign that can be performed via quantum design translation system 102 by employing an application external to quantum design translation system 102 (e.g., performed via quantum design translation system 102 by employing EM field analysis application 312a and/or static field application 312b).

In the example embodiment illustrated in FIG. 3, an entity as defined herein that implements quantum design translation system 102 can further use scripting interface 302a and/or GUI 302b to store such one or more QGeometries, QComponents, QDesigns, and/or associated parameter(s) described above in one or more user libraries 306. For example, such an entity can use scripting interface 302a and/or GUI 302b to store such one or more QGeometries, QComponents, QDesigns, and/or associated parameter(s) described above in a QDesigns library 306a and/or a QComponents library 306b illustrated in FIG. 3.

In the example embodiment illustrated in FIG. 3, an entity as defined herein that implements quantum design translation system 102 can further use scripting interface 302a and/or GUI 302b to access QRenderer API 308c of core API 308. In this embodiment, QRenderer API 308c can comprise one or more functions that can be used by such an entity to create and/or implement one or more QRenderers 310 that can translate such one or more QGeometries, QComponents, QDesigns, and/or associated parameters described above into a defined format of an application and/or render a visualization of such one or more QGeometries, QComponents, QDesigns, and/or associated parameters in the application. For example, in this embodiment, such an entity can use such one or more functions of QRenderer API 308c to create and/or implement a plotting renderer 310a, an electromagnetic simulation (EM-SIM) renderer 310b, an integrated circuit (IC) layout renderer 310c, and/or another renderer 310d of QRenderers 310. In multiple embodiments, each of such one or more QRenderers 310 (e.g., plotting renderer 310a, EM-SIM renderer 310b, IC layout renderer 310c, another renderer 310d, etc.) can comprise the same structure and/or functionality as that of quantum renderer component 110 described above with reference to FIG. 1.

In the example embodiment illustrated in FIG. 3, the one or more QRenderers 310 defined above can be implemented to translate the one or more QGeometries, QComponents, QDesigns, and/or associated parameters described above into a defined format of an application and/or to render a visualization of such one or more QGeometries, QComponents, QDesigns, and/or associated parameters in the application. In an example, EM-SIM renderer 310b can be implemented to translate such one or more QGeometries, QComponents, QDesigns, and/or associated parameters described above into a defined format of an EM field analysis application 312a and/or to render a visualization of such one or more QGeometries, QComponents, QDesigns, and/or associated parameters in EM field analysis application 312a. In another example, EM-SIM renderer 310b can be implemented to translate such one or more QGeometries, QComponents, QDesigns, and/or associated parameters described above into a defined format of a static field application 312b and/or to render a visualization of such one or more QGeometries, QComponents, QDesigns, and/or associated parameters in static field application 312b. In another example, IC layout renderer 310c can be implemented to translate such one or more QGeometries, QComponents, QDesigns, and/or associated parameters described above into a defined format of a fabrication application 312c and/or to render a visualization of such one or more QGeometries, QComponents, QDesigns, and/or associated parameters in fabrication application 312c. In an example, another renderer 310d can be implemented to translate such one or more QGeometries, QComponents, QDesigns, and/or associated parameters described above into a defined format of another external application 312d and/or to render a visualization of such one or more QGeometries, QComponents, QDesigns, and/or associated parameters in another external application 312d.

Figure 4:
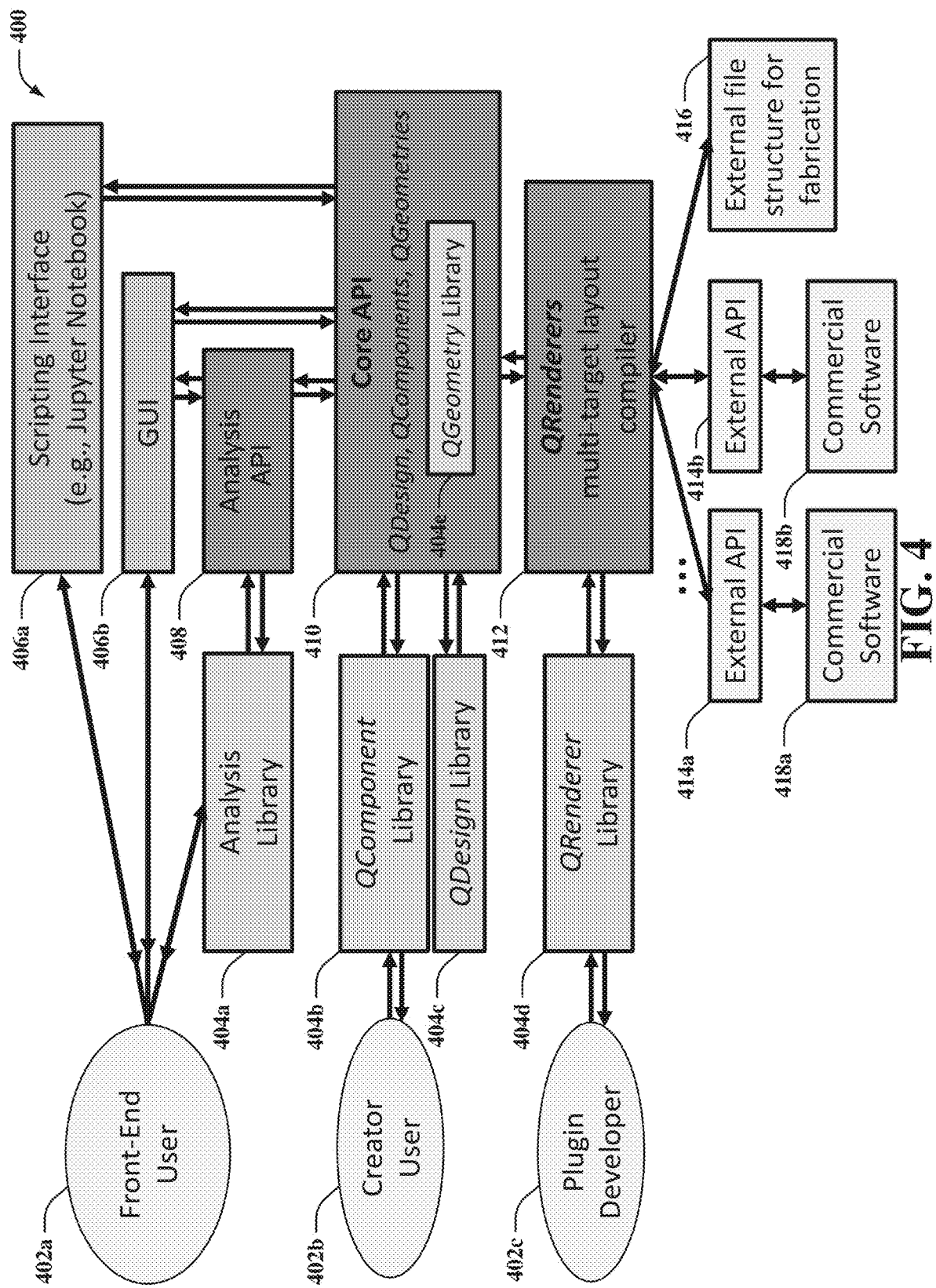
FIG. 4 illustrates a block diagram of an example, non-limiting system that can facilitate translation of a quantum design across multiple applications in accordance with one or more embodiments described herein.

FIG. 4 illustrates a block diagram of an example, non-limiting system 400 that can facilitate translation of a quantum design across multiple applications in accordance with one or more embodiments described herein. Repetitive description of like elements and/or processes employed in respective embodiments is omitted for sake of brevity.

In some embodiments, system 400 can comprise an example, non-limiting alternative embodiment of system 300. As illustrated in the example embodiment depicted in FIG. 4, system 400 can comprise one or more entities that can access one or more components of system 400 to perform one or more tasks and/or to implement one or more operations that can be performed by at least one component of system 400 in accordance with one or more embodiments of the subject disclosure described herein.

In the example embodiment illustrated in FIG. 4, a front-end user 402a can comprise a front-end entity (e.g., an entity as defined above) that can write code via a scripting interface 406a and/or use a GUI 406b of system 400 to design, analyze, and/or modify one or more QGeometries, QComponents, QDesigns, and/or associated parameters described above for simulation, fabrication, and/or testing. In this embodiment, to facilitate such design, analysis, and/or modification of such one or more QGeometries, QComponents, QDesigns, and/or associated parameters described above, front-end user 402a can use scripting interface 406a and/or GUI 406b to implement one or more functions of one or more APIs of system 400 and/or to access one or more libraries of system 400. In this embodiment: scripting interface 406a can comprise an example, non-limiting alternative embodiment of scripting interface 302a described above with reference to FIG. 3; and/or GUI 406b can comprise an example, non-limiting alternative embodiment of GUI 302b described above with reference to FIG. 3.

In the example embodiment illustrated in FIG. 4, to facilitate such design, analysis, and/or modification of such one or more QGeometries, QComponents, QDesigns, and/or associated parameters described above, front-end user 402a can use scripting interface 406a and/or GUI 406b to implement one or more functions of a core API 410 of system 400, where core API 410 can comprise an example, non-limiting alternative embodiment of core API 308 described above with reference to FIG. 3. In this embodiment, to facilitate such design, analysis, and/or modification of such one or more QGeometries, QComponents, QDesigns, and/or associated parameters described above, front-end user 402a can further use scripting interface 406a and/or GUI 406b to access: one or more QGeometries in a QGeometry library 404e of core API 410; one or more QComponents in a QComponent library 404b (e.g., a database, a memory device, memory 104, etc.) of system 400, where QComponent library 404b can comprise an example, non-limiting alternative embodiment of QComponents library 306b described above with reference to FIG. 3; and/or one or more QDesigns in a QDesign library 404c (e.g., a database, a memory device, memory 104, etc.) of system 400, where QDesign library 404c can comprise an example, non-limiting alternative embodiment of QDesigns library 306a described above with reference to FIG. 3. In this embodiment, such one or more QComponents and/or QDesigns can be created (e.g., using one or more functions of core API 410) by a creator user 402b and/or stored in QComponent library 404b and QDesign library 404c, respectively, by creator user 402b.

In the example embodiment illustrated in FIG. 4, creator user 402b can comprise a creator entity (e.g., an entity as defined herein) that can create one or more QComponents and/or QDesigns and/or store such one or more QComponents and/or QDesigns in QComponent library 404b and QDesign library 404c, respectively. In this embodiment, creator user 402b can have an intermediate knowledge of coding and functional knowledge of the code that can be used to implement one or more embodiments of the subject disclosure as described herein such as, for instance, system 400 and/or one or more components thereof (e.g., core API 410). In some embodiments, creator user 402b can provide code for the geographical structure of QComponents they design. In some embodiments, creator user 402b can further provide the appropriate indications of which QComponents will have alternative representations (e.g., a transmon qubit layout with the junction (e.g., Josephson junction) being flagged such that one or more QRenderers 412 recognize it and provide the appropriate alternative representation).

In the example embodiment illustrated in FIG. 4, to facilitate such design, analysis, and/or modification of such one or more QGeometries, QComponents, QDesigns, and/or associated parameters described above, front-end user 402a can further use scripting interface 406a and/or GUI 406b to access an analysis library 404a (e.g., a database, a memory device, memory 104, etc.) and/or an analysis API 408 of system 400, where analysis API 408 can comprise an example, non-limiting alternative embodiment of analysis API 308a described above with reference to FIG. 3. In this embodiment, front-end user 402a can access analysis library 404a and/or analysis API 408 to request and/or implement (e.g., via one or more functions of analysis API 408 and/or core API 410) an analysis of, for instance, one or more QGeometries, QComponents, QDesigns, and/or associated parameters described above. For example, front-end user 402a can access analysis library 404a and/or analysis API 408 to request and/or implement an analysis of one or more original QGeometries, QComponents, QDesigns, and/or associated parameters described above. In another example, front-end user 402a can access analysis library 404a and/or analysis API 408 to request and/or implement an analysis of one or more modified versions of the one or more original QGeometries, QComponents, QDesigns, and/or associated parameters described above. In this example, such one or more modified versions of the one or more original QGeometries, QComponents, QDesigns, and/or associated parameters described above can comprise modified version(s) of the original(s) that have been modified based on results data from, for instance, a simulation, an analysis, and/or a test that has been performed on such one or more original QGeometries, QComponents, QDesigns, and/or associated parameter(s) described above in.

In the example embodiment illustrated in FIG. 4, to facilitate simulation, fabrication, and/or testing of such one or more QGeometries, QComponents, QDesigns, and/or associated parameters described above (e.g., original and/or modified version(s)), front-end user 402a can use one or more functions of core API 410 to implement one or more QRenderers 412 of system 400. In this embodiment, such one or more QRenderers 412 can comprise example, non-limiting alternative embodiment(s) of QRenderers 310 described above with reference to FIG. 3. For instance, in this embodiment, such one or more QRenderers 412 can comprise one or more multi-target layout compilers that can translate such one or more QGeometries, QComponents, QDesigns, and/or associated parameters described above into a defined format of an application and/or render a visualization of such one or more QGeometries, QComponents, QDesigns, and/or associated parameters in the application. For example, in this embodiment but not illustrated in FIG. 4, such one or more QRenderers 412 can comprise plotting renderer 310a, EM-SIM renderer 310b, IC layout renderer 310c, and/or another renderer 310d of QRenderers 310 described above with reference to FIG. 3. In the example embodiment illustrated in FIG. 4, QRenderers 412 can be created (e.g., using one or more functions of core API 410) by a plugin developer 402c and/or stored in a QRenderer library 404d (e.g., a database, a memory device, memory 104, etc.) of system 400. In multiple embodiments, each of such one or more QRenderers 412 and/or each of such one or more QRenderers 310 (e.g., plotting renderer 310a, EM-SIM renderer 310b, IC layout renderer 310c, another renderer 310d, etc.) can comprise the same structure and/or functionality as that of quantum renderer component 110 described above with reference to FIG. 1.

In the example embodiment illustrated in FIG. 4, plugin developer 402c can comprise a plugin developer entity (e.g., an entity as defined herein) that can generate such one or more QRenderers 412 (e.g., via writing new code) and/or store such one or more QRenderers 412 in QRenderer library 404d. In this embodiment, plugin developer 402c can have expert knowledge of coding and/or the application for which they are creating such one or more QRenderers 412, as well as a good understanding of the quantum behavior of such one or more QGeometries, QComponents, and/or QDesigns described above. In some embodiments, given a certain QRenderer and/or application, plugin developer 402c can further identify and/or flag the appropriate alternative representation(s) for a certain QGeometry, QComponent, and/or QDesign that can enable such a QRenderer to translate the QGeometry, QComponent, and/or QDesign into a defined format of the application and/or render a visualization of the QGeometry, QComponent, and/or QDesign in the application. For example, in some embodiments, plugin developer 402c can generate (e.g., via writing code) such a certain QRenderer described above such that it recognizes a flag for a Josephson junction element in a transmon qubit, for instance, and represents it in an eigenmode simulation as a 2-dimensional (2D) square sheet with a resistor inductor capacitor (RLC) circuit boundary (RLC boundary) set to the inductance value as given by front-end user 402a (e.g., based on what frequency the ground state of the qubit is to be).

In the example embodiment illustrated in FIG. 4, front-end user 402a can further use scripting interface 406a and/or GUI 406b to implement one or more QRenderers 412 (e.g., via core API 410) that can translate such one or more QGeometries, QComponents, QDesigns, and/or associated parameters described above into a defined format of an application and/or render a visualization of such one or more QGeometries, QComponents, QDesigns, and/or associated parameters in the application. In this embodiment, such an application can comprise commercial software 418a and/or 418b, which can respectively comprise, for instance, an electromagnetic and/or simulation application, a fabrication application, and/or another application. In this embodiment, such one or more QRenderers 412 can access, implement, and/or control commercial software 418a and/or 418b using one or more functions of external API 414a and/or 414b, respectively, and/or one or more functions of core API 410. In this embodiment, such one or more QRenderers 412 can translate the one or more QGeometries, QComponents, QDesigns, and/or associated parameters described above into a defined format of commercial software 418a and/or 418b and/or render a visualization of such one or more QGeometries, QComponents, QDesigns, and/or associated parameters in commercial software 418a and/or 418b. As illustrated in the example embodiment depicted in FIG. 4, such one or more QRenderers 412 can also translate the one or more QGeometries, QComponents, QDesigns, and/or associated parameters described above into an external file structure 416 that can comprise a defined format of a fabrication application that can be employed (e.g., accessed, implemented, controlled, etc.) by the one or more QRenderers 412 to fabricate an integrated circuit (IC) comprising such one or more QGeometries, QComponents, and/or QDesigns.

In some embodiments, front-end user 402a can be completely isolated from the running of any external software application such as, for instance, commercial software 418a and/or 418b. Instead, in these embodiments, front-end user 402a can input a request to core API 410 (e.g., via scripting interface 406a and/or GUI 406b) to translate such one or more QGeometries, QComponents, QDesigns, and/or associated parameters described above into a defined format of commercial software 418a and/or 418b and/or to render a visualization of such one or more QGeometries, QComponents, QDesigns, and/or associated parameters in commercial software 418a and/or 418b. In some embodiments, front-end user 402a can create a QDesign using core API 410, QComponent library 404b, QDesign library 404c, and/or QGeometry library 404e. In some embodiments, front-end user 402a can request an analysis (e.g., an electron paramagnetic resonance (EPR), etc.) of such a QDesign from core API 410 and indicate which EM software application is present on their system. In some embodiments, front-end user 402a can then implement (e.g., via core API 410) the one or more QRenderers 412 to: render the QDesign natively and optimally into the EM software application (e.g., turning any QGeometry into an appropriate alternative representation for such a simulation and/or analysis); run the simulation (e.g., an eigenmode solution); extract the results back into such one or more QRenderers 412 and/or core API 410; and/or present the results of the chosen analysis to front-end user 402a via scripting interface 406a and/or GUI 406b. In some embodiments, if happy with the results, front-end user 402a can then input a request into core API 410 (e.g., via scripting interface 406a and/or GUI 406b) to render the QDesign into a format suitable for fabrication such as, for instance, external file structure 416 and/or to render a visualization of the QDesign in a fabrication application to facilitate fabrication of an IC comprising the QDesign.

Figure 5:
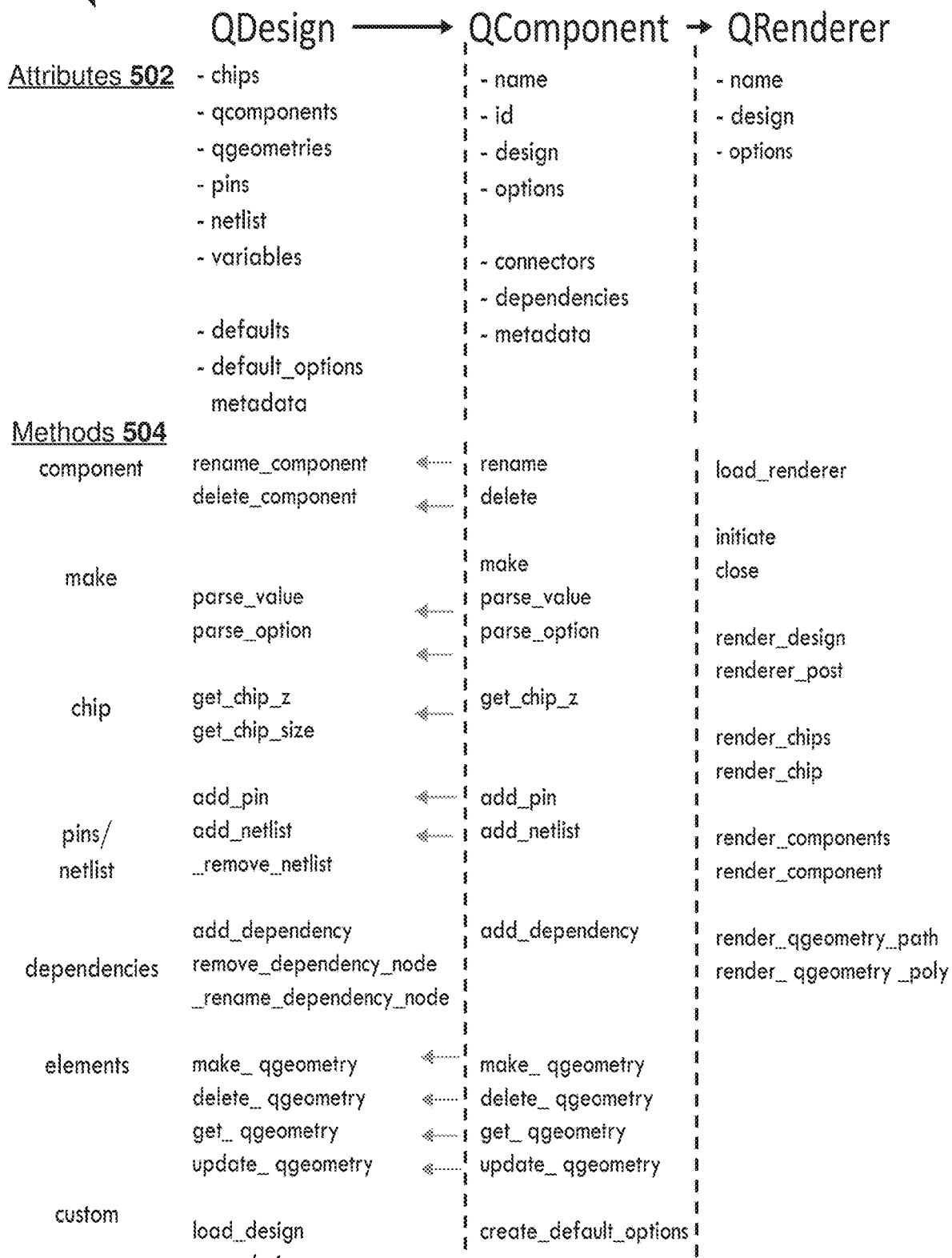
FIGS. 5 and 6 illustrate diagrams of example, non-limiting information that can facilitate translation of a quantum design across multiple applications in accordance with one or more embodiments described herein.

FIG. 5 illustrates a diagram of example, non-limiting information 500 that can facilitate translation of a quantum design across multiple applications in accordance with one or more embodiments described herein. Repetitive description of like elements and/or processes employed in respective embodiments is omitted for sake of brevity.

Information 500 can comprise one or more attributes 502 and/or one or more methods 504 that can correspond to a QDesign, a QComponent, and/or a QRenderer of the subject disclosure. In some embodiments, attributes 502 can comprise data structures and/or data features that can correspond to and represent each QGeometry, QComponent, QDesign, and/or QRenderer described above. In some embodiments, methods 504 can comprise commands that can operate on one or more attributes 502. In some embodiments, attributes 502 and/or methods 504 can be stored on one or more libraries of the subject disclosure (e.g., quantum library component 108, QDesigns library 306a, QComponents library 306b, analysis library 404a, QComponent library 404b, QDesign library 404c, QRenderer library 404d, QGeometry library 404e, etc.) as described above with reference to FIGS. 1, 3, and 4.

In some embodiments, one or more attributes 502 and/or methods 504 can be used by one or more entities as defined herein that implement quantum design translation system 102 (e.g., front-end user 402a, creator user 402b, plugin developer 402c, etc.) to create such one or more QGeometries, QComponents, QDesigns, and/or QRenderers described above. For example, when front-end user 402a creates a QDesign comprising one or more QComponents, which comprise one or more QGeometries, one or more APIs of the subject disclosure (e.g., core API 308, core API 410, etc.) can use one or more of the functions of methods 504 illustrated in FIG. 5 to create such a QDesign (e.g., functions such as, for instance, "make," "parse," "get," "add," "delete," "update," "create," "rename," etc.).

In some embodiments, one or more attributes 502 and/or one or more methods 504 can be used by one or more APIs and/or QRenderers of the subject disclosure (e.g., quantum renderer component 110, one or more APIs of core API 308, one or more QRenderers of QRenderers 310, core API 410, one or more QRenderers of QRenderers 412, etc.) to translate such one or more QGeometries, QComponents, QDesigns, and/or associated parameters described above into a defined format of an application and/or to render a visualization of such one or more QGeometries, QComponents, QDesigns, and/or associated parameters in the application. For example, one or more of such APIs and/or QRenderers of the subject disclosure can use one or more of the functions of methods 504 illustrated in FIG. 5 to perform such translation and/or rendering operations described above (e.g., "load," "initiate," "close," "render," etc.).

Figure 6:
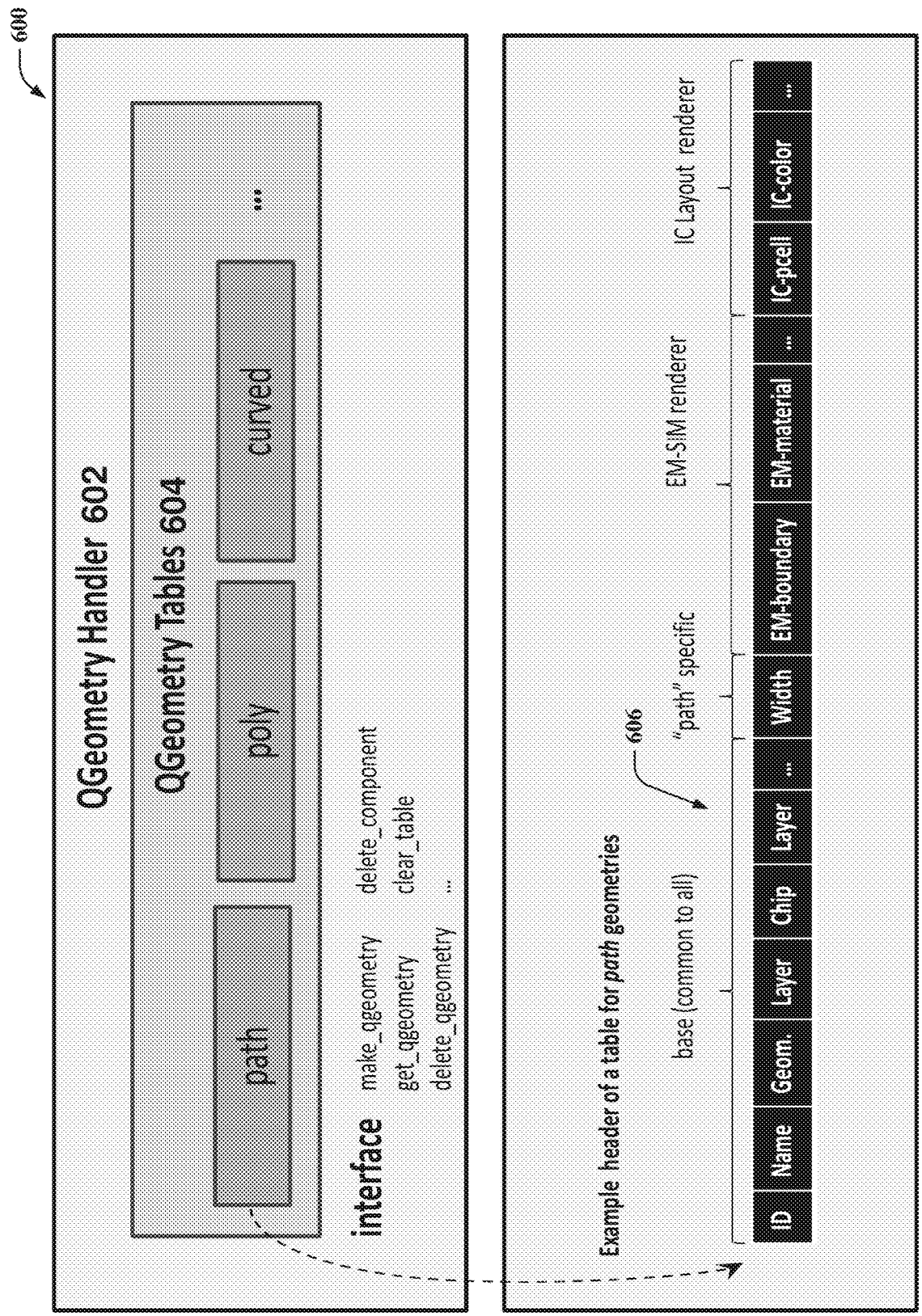

FIG. 6 illustrates a diagram of example, non-limiting information 600 that can facilitate translation of a quantum design across multiple applications in accordance with one or more embodiments described herein. Repetitive description of like elements and/or processes employed in respective embodiments is omitted for sake of brevity.

Information 600 can comprise a QGeometry handler 602 that can comprise one or more QGeometry tables 604 (e.g., databases) as illustrated in FIG. 6. In some embodiments, QGeometry handler 602 and/or QGeometry tables 604 can comprise a dictionary of tables (e.g., pandas DataFrames, etc.) for each type of QGeometry (e.g., polygon (poly), path, curved structure (e.g., curved junction), etc.). In some embodiments, "QGeometry_COLUMNS" can specify the column names that each table can have and there can be a special base dictionary that can specify column names common to all. In some embodiments, one or more QRenderers describe herein can register one or more default QGeometry properties.

In some embodiments, QGeometry handler 602 and/or QGeometry tables 604 can comprise a data structure and logic structure that enables storing of one or more QGeometries described above (e.g., "path," "poly," and/or "curved" as depicted in FIG. 6). In some embodiments, each of the QGeometry tables 604 can store primitive common base attributes for all the QGeometry. In some embodiments, each QGeometry table 604 can be extended by one or more QRenderers of the subject disclosure (e.g., quantum renderer component 110, one or more renderers of QRenderers 310, one or more renderers of QRenderers 412, etc.) to specify one or more features of the QGeometry (e.g., width, etc.) when such QRenderer(s) translate a QGeometry, QComponent, and/or QDesign into a defined format of an application and/or renders a visualization of such QGeometry, QComponent, and/or QDesign in the application. For example, as illustrated by example header 606 depicted in FIG. 6, where example header 606 comprises an example header of a table for path QGeometry, a QGeometry table 604 comprising a path QGeometry can have primitive base attributes common to all including, but not limited to, identification (ID), name, geometry (geom.), layer, chip, and/or another attribute. In this example, example header 606 can further comprise one or more features of a path QGeometry such as, for instance, width, that can be extended by one or more QRenderers of the subject disclosure as described above to specify such feature(s) of the path QGeometry when such QRenderer(s) translate the path QGeometry into a defined format of an application and/or renders a visualization of the path QGeometry in the application. For instance, a QRenderer of the subject disclosure comprising an EM-SIM renderer can extend such feature(s) using one or more functions depicted in FIG. 6 (e.g., EM-boundary, EM-material, etc.). In another example, a QRenderer of the subject disclosure comprising an IC layout renderer can extend such feature(s) using one or more functions depicted in FIG. 6 (e.g., IC-pcell, IC-color, etc.).

Figure 7A:
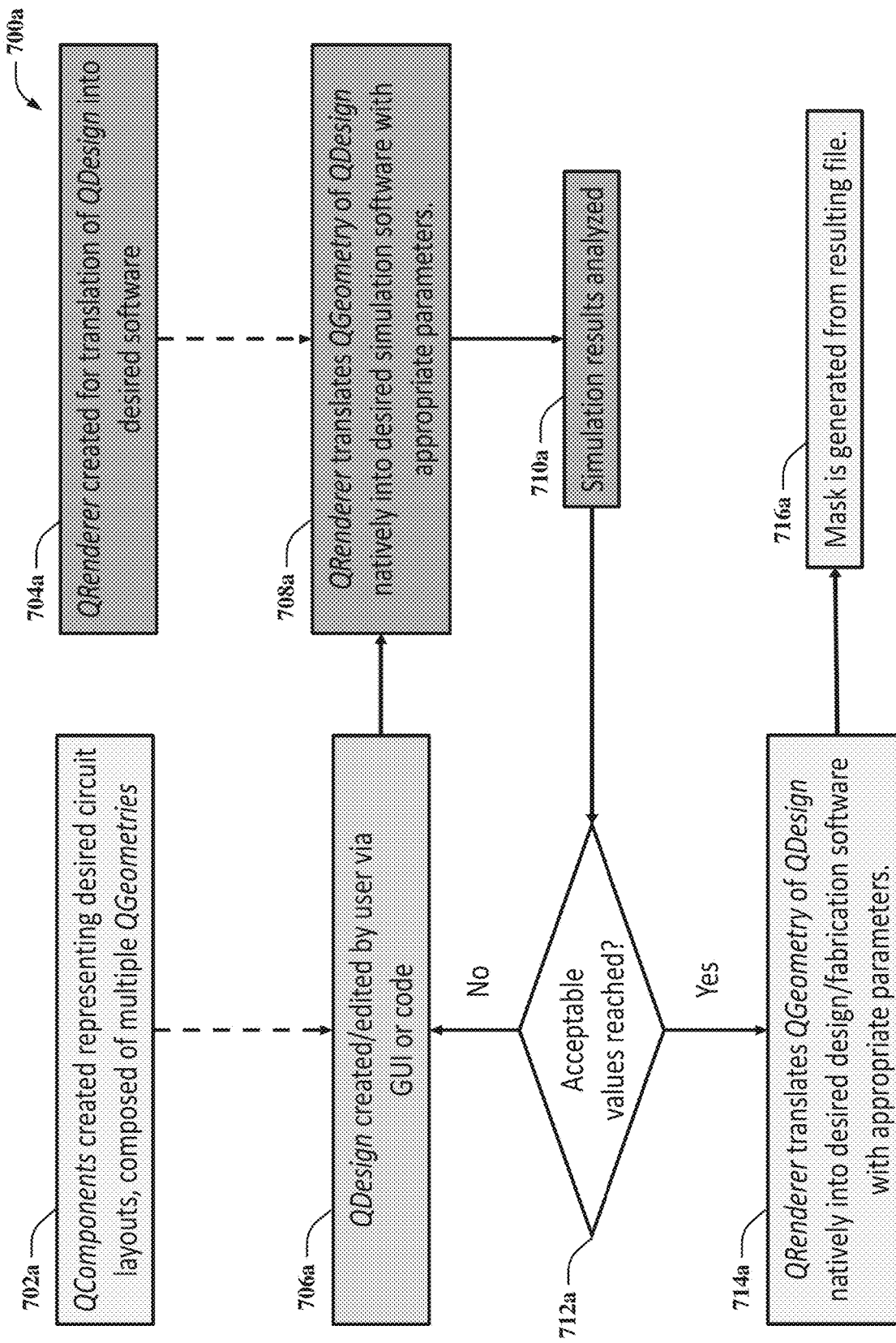
FIGS. 7A and 7B illustrate flow diagrams of example, non-limiting computer-implemented methods that can facilitate translation of a quantum design across multiple applications in accordance with one or more embodiments described herein.

FIG. 7A illustrates a flow diagram of an example, non-limiting computer-implemented method 700a that can facilitate translation of a quantum design across multiple applications in accordance with one or more embodiments described herein. Repetitive description of like elements and/or processes employed in respective embodiments is omitted for sake of brevity.

At 702a, computer-implemented method 700a can comprise creating QComponents representing desired circuit layouts, composed of multiple QGeometries. For example, front-end user 402a can create such QComponents as described above with reference to FIG. 4 by using scripting interface 406a and/or GUI 406b to access and/or implement one or more functions of core API 410 that can facilitate retrieval of one or more QGeometries stored in QGeometry library 404e that front-end user 402a can use to create (e.g., via one or more functions of core API 410) such QComponents.

At 704a, computer-implemented method 700a can comprise creating QRenderer for translation of a QDesign into desired software. For example, plugin developer 402c can create one or more QRenderers 412 that can be stored in QRenderer library 404d as described above with reference to FIG. 4.

At 706a, computer-implemented method 700a can comprise creating and/or editing a QDesign by a user via a GUI or code. For example, front-end user 402a can create such a QDesign as described above with reference to FIG. 4 by using scripting interface 406a and/or GUI 406b to access and/or implement one or more functions of core API 410 that can facilitate retrieval and combination of one or more QGeometries and/or QComponents stored in QGeometry library 404e and/or QComponent library 404b, respectively. In this example, such combination of the one or more QGeometries and/or QComponents can constitute creating such a QDesign, where front-end user 402a can further edit the QDesign using the same retrieval and combination process described above.

At 708a, computer-implemented method 700a can comprise a QRenderer translating a QGeometry of a QDesign natively into a desired simulation software with appropriate parameters. For example, as described above with reference to FIG. 4, a QRenderer of QRenderers 412 (e.g., a QRenderer comprising an EM-SIM renderer such as, for instance, EM-SIM renderer 310b described above with reference to FIG. 3) can translate one or more QGeometries, QComponents, QDesigns, and/or associated parameters described above into a defined format of an application and/or render a visualization of such one or more QGeometries, QComponents, QDesigns, and/or associated parameters in the application. In this example, such a QRenderer can further employ the application to perform the simulation of such one or more QGeometries, QComponents, QDesigns, and/or associated parameters. In this example, such an application can comprise an EM field analysis application (e.g., EM field analysis application 312a described above with reference to FIG. 3) and/or a static field application (e.g., static field application 312b described above with reference to FIG. 3).

At 710a, computer-implemented method 700a can comprise analyzing simulation results. For example, as described above with reference to FIG. 4, front-end user 402a can use scripting interface 406a and/or GUI 406b to access and/or implement one or more functions of core API 410 and/or analysis API 408 to facilitate such analysis of the simulation results.

At 712a, computer-implemented method 700a can comprise determining whether the values reached are acceptable. For example, based on such analysis of the simulation results described above at 710a, front-end user 402a can determine whether one or more parameter values in the simulation results are acceptable.

If it is determined at 712a that the values reached are acceptable, at 714a, computer-implemented method 700a can comprise a QRenderer translating the QGeometry of the QDesign natively into a desired design and/or fabrication software with appropriate parameters. For example, as described above with reference to FIG. 4, a QRenderer of QRenderers 412 (e.g., a QRenderer comprising an IC layout renderer such as, for instance, IC layout renderer 310c described above with reference to FIG. 3) can translate one or more QGeometries, QComponents, QDesigns, and/or associated parameters described above into a defined format of a fabrication application (e.g., fabrication application 312c described above with reference to FIG. 3) and/or render a visualization of such one or more QGeometries, QComponents, QDesigns, and/or associated parameters in the fabrication application. In this example, such a QRenderer can further employ the fabrication application to generate a mask using the defined format and/or the visualization to facilitate fabrication of an IC comprising one or more QGeometries, QComponents, and/or QDesigns.

At 716a, computer-implemented method 700a can comprise generating a mask from resulting file (e.g., generating a mask using the file resulting from operation 714a, where such a mask can be generated using photolithographic and/or chemical processing steps that facilitate fabrication of an integrated circuit). For example, such a QRenderer described above that can perform operation 714a (e.g., IC layout renderer 310c) can further employ the fabrication application to generate (e.g., via photolithographic and/or chemical processing steps that facilitate fabrication of an integrated circuit) a mask using the defined format and/or the visualization to facilitate fabrication of an IC comprising such one or more QGeometries, QComponents, and/or QDesigns described above.

If it is determined at 712a that the values reached are not acceptable, computer-implemented method 700a can comprise returning to operation 706a where the user (e.g., front-end user 402a) can edit the QDesign as described above. In some embodiments, computer-implemented method 700a can comprise repeating operations 706a, 708a, 710a, and/or 712a until the user (e.g., front-end user 402a) is satisfied with the results of the simulation performed at operation 710a or until the user creates a different QDesign at operation 706a.

Figure 7B:
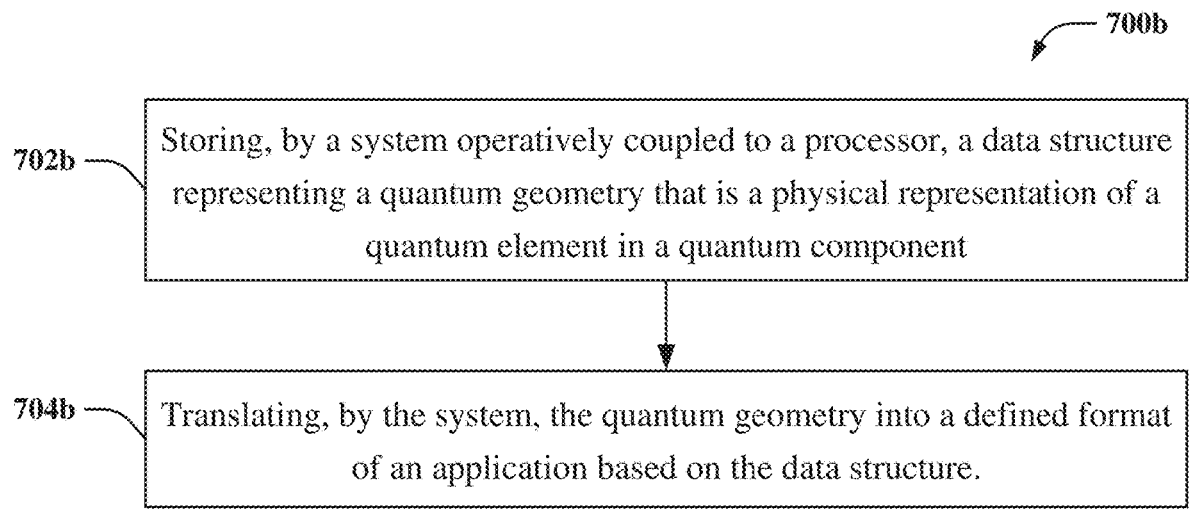

FIG. 7B illustrates a flow diagram of an example, non-limiting computer-implemented method 700b that can facilitate translation of a quantum design across multiple applications in accordance with one or more embodiments described herein. Repetitive description of like elements and/or processes employed in respective embodiments is omitted for sake of brevity.

At 702b, computer-implemented method 700b can comprise storing, by a system (e.g., via quantum design translation system 102 and/or quantum library component 108) operatively coupled to a processor (e.g., processor 106), a data structure (e.g., QGeometry handler 602, QGeometry table 604) representing a quantum geometry (e.g., a QGeometry as described herein) that is a physical representation of a quantum element (e.g., a path, a polygon, a curve, etc.) in a quantum component (e.g., a qubit, a CPW, etc.).

At 704b, computer-implemented method 700b can comprise translating, by the system (e.g., via quantum design translation system 102 and/or quantum renderer component 110), the quantum geometry into a defined format (e.g., a native format, a file format, a file type, etc.) of an application (e.g., an EM field analysis application, a static field application, a fabrication application, etc.) based on (e.g., using) the data structure.

Quantum design translation system 102 can be associated with various technologies. For example, quantum design translation system 102 can be associated with quantum computing technologies, quantum device design technologies, quantum device simulation technologies, quantum device fabrication and/or testing technologies, quantum hardware and/or software technologies, quantum circuit technologies, superconducting circuit technologies, compiler technologies, data structure technologies, machine learning technologies, artificial intelligence technologies, cloud computing technologies, and/or other technologies.

Quantum design translation system 102 can provide technical improvements to systems, devices, components, operational steps, and/or processing steps associated with the various technologies identified above. For example, quantum design translation system 102 can store a data structure representing a quantum geometry that is a physical representation of a quantum element in a quantum component; and/translate the quantum geometry into a defined format of an application based on the data structure. In this example, quantum design translation system 102 can further render a visualization of at least one of the quantum geometry or the quantum component in the application at runtime of the application based on the data structure. In this example, quantum design translation system 102 can perform such a translation of the quantum geometry into the defined format of the application and/or such a rendering of the visualization of the quantum geometry in the application to facilitate reduced time in designing, simulating, fabricating, and testing a quantum device and/or elimination of one or more redundant operations performed in designing, simulating, fabricating, and testing the quantum device.

Quantum design translation system 102 can provide technical improvements to a processing unit (e.g., processor 106, processing unit 814, etc.) that can be associated with quantum design translation system 102. For example, by reducing the time it takes to design, simulate, fabricate, and test a quantum device and/or by eliminating one or more redundant operations performed in designing, simulating, fabricating, and testing the quantum device, quantum design translation system 102 can thereby facilitate improved performance and/or efficiency of one or more processors (e.g., processor 106, processing unit 814, etc.) executing one or more operations of one or more applications used to design, simulate, fabricate, and/or test the quantum device. In this example, by facilitating improved performance and/or efficiency of such one or more processors (e.g., processor 106, processing unit 814, etc.) as described above, quantum design translation system 102 can further reduce the number of processing cycles that must be performed by such one or more processors in executing the one or more operations of the one or more applications used to design, simulate, fabricate, and/or test the quantum device. In this example, by reducing the number of processing cycles that must be performed by such one or more processors as described above, quantum design translation system 102 can facilitate reduced computational costs of the one or more processors in executing the one or more operations of the one or more applications used to design and/or simulate the quantum device. In this example, quantum design translation system 102 can further reduce computational costs of the one or more processors in executing the one or more operations of the one or more applications used to fabricate and/or test the quantum device as a result of the built-in design rule checking described above with respect to QGeometries (e.g., by flagging of one or more features of a certain QGeometry such that a certain QRenderer translates and/or renders the QGeometry appropriately (e.g., natively) into a certain fabrication and/or testing application). In this example, quantum design translation system 102 can further reduce the number of cycles (e.g., fabrication and/or test cycles) and/or work hours involved with fabricating and/or testing the quantum device. In this example, quantum design translation system 102 can further automate certain operations of the design, simulation, fabrication, and/or testing of the quantum device.

Based on such reduced time in designing, simulating, fabricating, and testing a quantum device and/or elimination of one or more redundant operations performed in designing, simulating, fabricating, and testing the quantum device as described above, a practical application of quantum design translation system 102 is that it can be implemented to efficiently design, simulate, fabricate, and test a quantum device comprising a QDesign described herein. For example, a practical application of quantum design translation system 102 is that it can be implemented to translate a QDesign into different defined formats (e.g., a native format, a file format, a file type, etc.) of various applications (e.g., design, simulation, fabrication, etc.) and/or to render a visualization of the QDesign in such various applications without having to recreate (e.g., redraw, redesign, etc.) the QDesign in each of such various applications.

It should be appreciated that quantum design translation system 102 provides a new approach driven by relatively new quantum computing technologies. For example, quantum design translation system 102 provides a new approach to design, simulate, fabricate, and/or test a quantum device comprising a QDesign as described herein by enabling creation of such a QDesign in quantum design translation system 102, where the QDesign can be translated across various applications used to design, simulate, fabricate, and/or test the quantum device without having to recreate (e.g., redraw, redesign, etc.) the QDesign in each of such various applications.

Quantum design translation system 102 can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. Quantum design translation system 102 and/or components thereof, can be employed to solve new problems that arise through advancements in technologies mentioned above, employment of quantum computing systems, cloud computing systems, computer architecture, and/or another technology.

It is to be appreciated that quantum design translation system 102 can utilize various combinations of electrical components, mechanical components, and circuitry that cannot be replicated in the mind of a human or performed by a human, as the various operations that can be executed by quantum design translation system 102 and/or components thereof as described herein are operations that are greater than the capability of a human mind. For instance, the amount of data processed, the speed of processing such data, or the types of data processed by quantum design translation system 102 over a certain period of time can be greater, faster, or different than the amount, speed, or data type that can be processed by a human mind over the same period of time.

According to several embodiments, quantum design translation system 102 can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that quantum design translation system 102 can include information that is impossible to obtain manually by an entity, such as a human user. For example, the type, amount, and/or variety of information included in quantum design translation system 102, quantum library component 108, quantum renderer component 110, system 300, system 400, information 500, and/or information 600 can be more complex than information obtained manually by a human user.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 8:
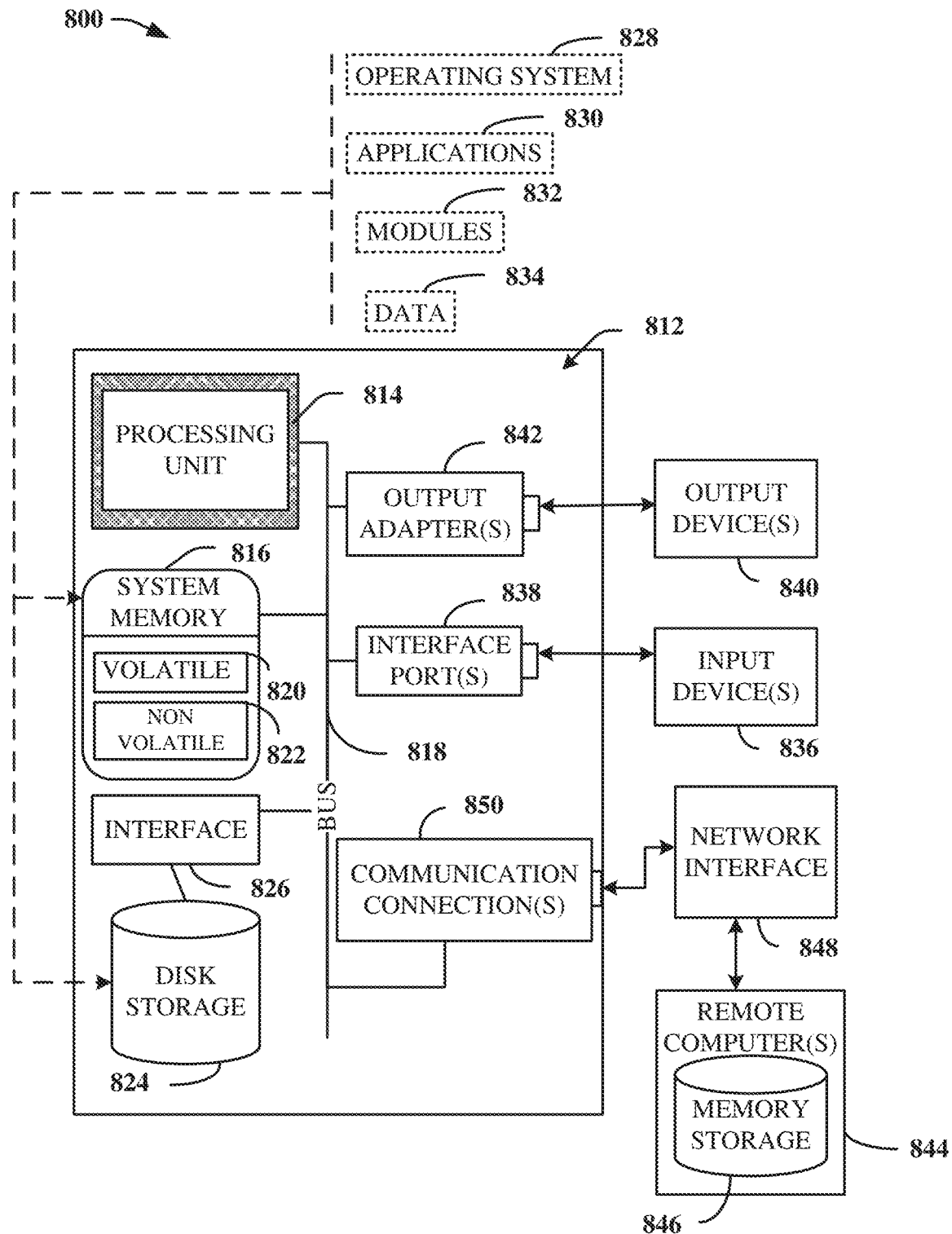
FIG. 8 illustrates a block diagram of an example, non-limiting operating environment in which one or more embodiments described herein can be facilitated.

In order to provide a context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and nonvolatile memory 822. The basic input/output system (BIOS), containing the basic routines to transfer information between elements within the computer 812, such as during start-up, is stored in nonvolatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818.

While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
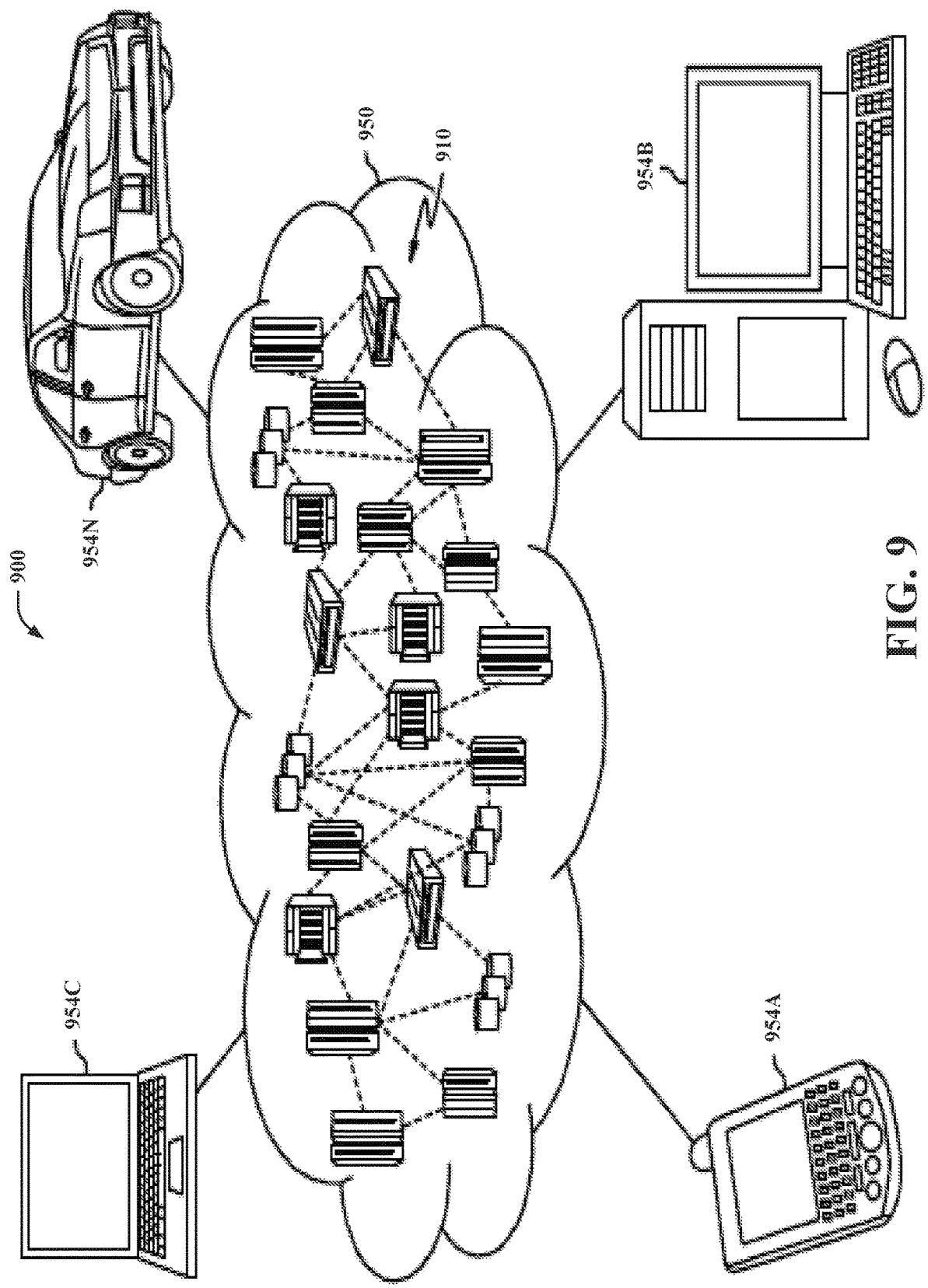
FIG. 9 illustrates a block diagram of an example, non-limiting cloud computing environment in accordance with one or more embodiments of the subject disclosure.

Referring now to FIG. 9, an illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C, and/or automobile computer system 954N may communicate. Although not illustrated in FIG. 9, cloud computing nodes 910 can further comprise a quantum platform (e.g., quantum computer, quantum hardware, quantum software, etc.) with which local computing devices used by cloud consumers can communicate. Nodes 910 may communicate with one another. They may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
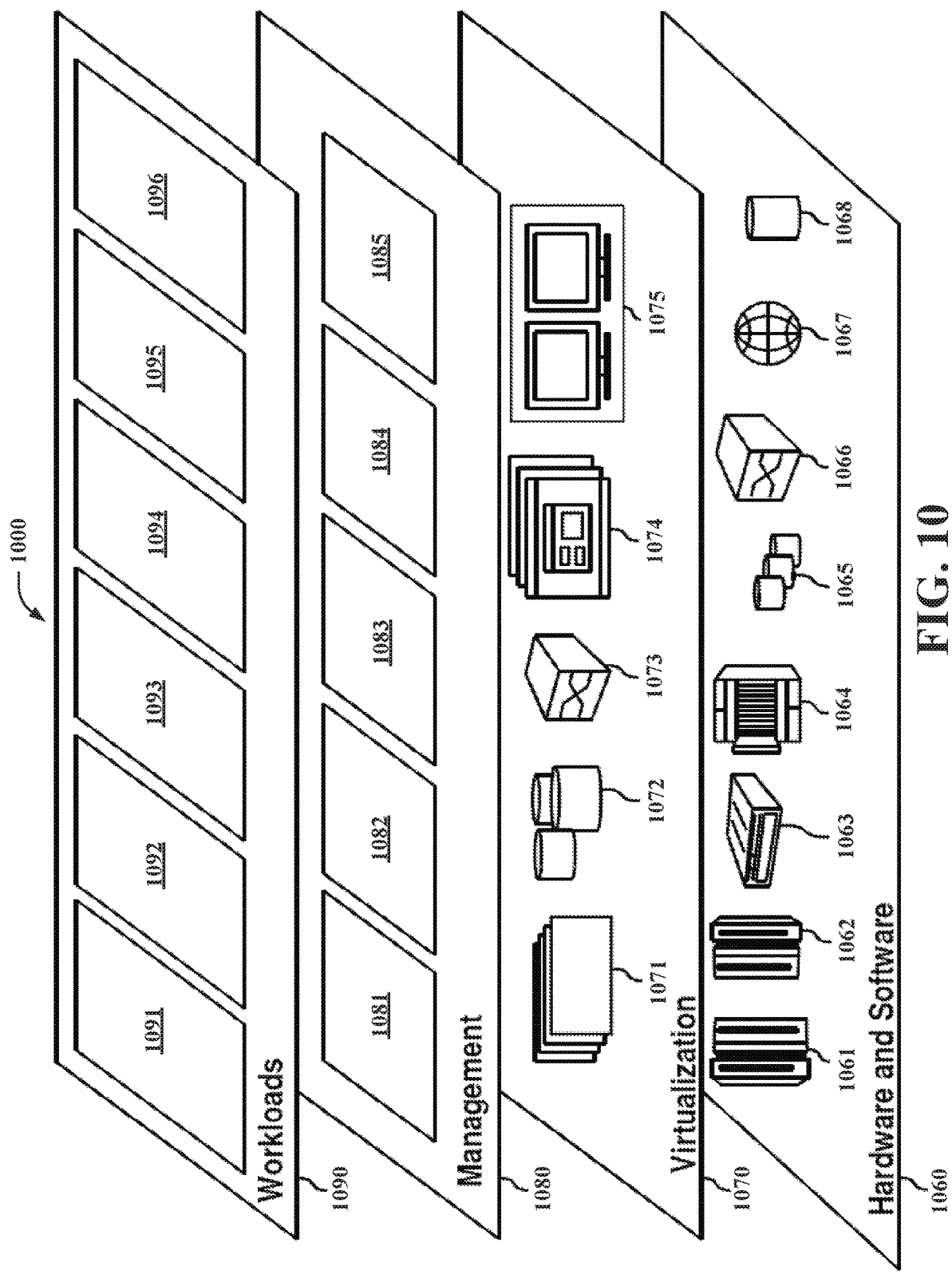
FIG. 10 illustrates a block diagram of example, non-limiting abstraction model layers in accordance with one or more embodiments of the subject disclosure.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture based servers 1062; servers 1063; blade servers 1064; storage devices 1065; and networks and networking components 1066. In some embodiments, software components include network application server software 1067, database software 1068, quantum platform routing software (not illustrated in FIG. 10), and/or quantum software (not illustrated in FIG. 10).

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and quantum design translation software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor that executes at least one of the computer executable components that:
   stores element data structures respectively representing quantum geometric primitives of elements employable in constructing quantum components;
   stores renderers respectively associated with different quantum design software applications using different quantum design formats, wherein the renderers translate the element data structures into equivalent elements in the respective different quantum design formats of the different quantum design software applications, wherein the different quantum design software applications respectively comprise at least of quantum design simulation functionality, quantum design editing functionality, or quantum design fabrication functionality; and
   translates, using a first renderer of the stored renderers, a quantum design comprising a group of the element data structures, into a first quantum design in a first quantum design format natively employable by a first quantum design software application of the different quantum design software applications.

2. The system of claim 1, wherein the at least one of the computer executable components further:
translates, using a second renderer of the stored renderers, the quantum design into a second quantum design in a second quantum design format natively employable by a second quantum design software application of the different quantum design software applications.

3. The system of claim 1, wherein the at least one of the computer executable components further:
facilitates, via a user interface, generating the quantum design.

4. The system of claim 1, wherein the at least one of the computer executable components further:
generates a visualization of the quantum design based on one or more attributes of the first quantum design software application that indicate how a geometric primitive is to be translated into the first quantum defined format.

5. The system of claim 1, wherein the first renderer sets a meshing condition based on the first quantum defined format to optimize simulation of the quantum design in the first quantum design software application.

6. The system of claim 1, wherein the first renderer sets a boundary condition based on the first quantum defined format to optimize simulation of the quantum design in the first quantum design software application.

7. The system of claim 1, wherein the first quantum defined format is a quantum device fabrication file format employable for generating a mask for fabrication of a quantum device.

8. A computer-implemented method, comprising:
storing, by a system operatively coupled to a processor, element data structures respectively representing quantum geometric primitives of elements employable in constructing quantum components;
storing, by the system, renderers respectively associated with different quantum design software applications using different quantum design formats, wherein the renderers translate the element data structures into equivalent elements in the respective different quantum design formats of the different quantum design software applications, wherein the different quantum design software applications respectively comprise at least of quantum design simulation functionality, quantum design editing functionality, or quantum design fabrication functionality; and
translating, by the system, using a first renderer of the stored renderers, a quantum design comprising a group of the element data structures, into a first defined format natively employable by a first quantum design software application of the different quantum design software applications.

9. The computer-implemented method of claim 8, further comprising:
translating, by the system, using a second renderer of the stored renderers, the quantum design into a second quantum design in a second quantum design format natively employable by a second quantum design software application of the different quantum design software applications.

10. The computer-implemented method of claim 8, further comprising:
facilitating, by the system, via a user interface, generating the quantum design.

11. The computer-implemented method of claim 8, further comprising:
generating, by the system, a visualization of the quantum design based on one or more attributes of the first quantum design software application that indicate how a geometric primitive is to be translated into the first quantum defined format.

12. The computer-implemented method of claim 8, wherein the first renderer sets a meshing condition based on the first quantum defined format to optimize simulation of the quantum design in the first quantum design software application.

13. The computer-implemented method of claim 8, wherein the first renderer sets a boundary condition based on the first quantum defined format to optimize simulation of the quantum design in the first quantum design software application.

14. The computer-implemented method of claim 8, wherein the first quantum defined format is a quantum device fabrication file format employable for generating a mask for fabrication of a quantum device.

15. A computer program product facilitating a quantum design translation process, the computer program product comprising a computer readable storage medium having program instructions embodied therewith, the program instructions executable by a processor to cause the processor to:
store, in at least one data storage device, element data structures respectively representing quantum geometric primitives of elements employable in constructing quantum components;
store, in the at least one data storage device, renderers respectively associated with different quantum design software applications using different quantum design formats, wherein the renderers translate the element data structures into equivalent elements in the respective different quantum design formats of the different quantum design software applications, wherein the different quantum design software applications respectively comprise at least of quantum design simulation functionality, quantum design editing functionality, or quantum design fabrication functionality; and
translate, using a first renderer of the stored renderers, a quantum design comprising a group of the element data structures, into a first defined format natively employable by a first quantum design software application of the different quantum design software applications.

16. The computer program product of claim 15, wherein the program instructions are further executable by the processor to cause the processor to:
translate, using a second renderer of the stored renderers, the quantum design into a second quantum design in a second quantum design format natively employable by a second quantum design software application of the different quantum design software applications.

17. The computer program product of claim 15, wherein the program instructions are further executable by the processor to cause the processor to:
facilitate, via a user interface, generating the quantum design.

18. The computer program product of claim 15, wherein the program instructions are further executable by the processor to cause the processor to:
generate a visualization of the quantum design based on one or more attributes of the first quantum design software application that indicate how a geometric primitive is to be translated into the first quantum defined format.

19. The computer program product of claim 15, wherein the first renderer
sets a meshing condition based on the first quantum defined format to optimize simulation of the quantum design in the first quantum design software application.

20. The computer program product of claim 15, wherein the first renderer sets a boundary condition based on the first quantum defined format to optimize simulation of the quantum design in the first quantum design software application.

* * * * *